United States Patent
Sun et al.

(10) Patent No.: US 11,563,068 B2
(45) Date of Patent: Jan. 24, 2023

(54) SUBSTANTIALLY TRANSPARENT DISPLAY SUBSTRATE, SUBSTANTIALLY TRANSPARENT DISPLAY APPARATUS, AND METHOD OF FABRICATING SUBSTANTIALLY TRANSPARENT DISPLAY SUBSTRATE

(71) Applicant: BOE Technology Group Co., Ltd., Beijing (CN)

(72) Inventors: Hongda Sun, Beijing (CN); Youngsuk Song, Beijing (CN); Wei Liu, Beijing (CN); Jainye Zhang, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 16/753,449

(22) PCT Filed: Aug. 22, 2019

(86) PCT No.: PCT/CN2019/102000
§ 371 (c)(1),
(2) Date: Apr. 3, 2020

(87) PCT Pub. No.: WO2020/206901
PCT Pub. Date: Oct. 15, 2020

(65) Prior Publication Data
US 2021/0225950 A1    Jul. 22, 2021

(30) Foreign Application Priority Data

Apr. 9, 2019 (CN) .......................... 201910282382.4

(51) Int. Cl.
*H01L 27/32* (2006.01)
*G02F 1/1362* (2006.01)

(52) U.S. Cl.
CPC ...... *H01L 27/326* (2013.01); *G02F 1/136286* (2013.01); *H01L 27/3276* (2013.01)

(58) Field of Classification Search
CPC .......................... H01L 27/326; H01L 27/3276
See application file for complete search history.

(56) References Cited

U.S. PATENT DOCUMENTS

| 8,422,702 B2 | 4/2013 | Kim et al. |
| 2014/0077207 A1 | 3/2014 | Gao et al. |

(Continued)

FOREIGN PATENT DOCUMENTS

| CN | 102890378 A | 1/2013 |
| CN | 104103648 A | 10/2014 |

(Continued)

OTHER PUBLICATIONS

International Search Report & Written Opinion dated Jan. 16, 2020, regarding PCT/CN2019/102000.

(Continued)

*Primary Examiner* — Douglas M Menz
(74) *Attorney, Agent, or Firm* — Intellectual Valley Law, P.C.

(57) ABSTRACT

A substantially transparent display substrate is provided. The substantially transparent display substrate includes a base substrate; multiple insulating layers on the base substrate and in a display area of the substantially transparent display substrate; and a plurality of grooves in at least a first insulating layer of the multiple insulating layers, wherein at least one of the plurality of grooves at least partially extending into the first insulating layer. The display area includes a plurality of subpixel regions spaced apart from each other by an inter-subpixel region. A respective one of the plurality of subpixel regions includes a light emitting sub-region and a substantially transparent sub-region. At least a portion of (Continued)

a respective one of the plurality of grooves is about an edge of the substantially transparent sub-region of the respective one of the plurality of subpixel regions.

18 Claims, 16 Drawing Sheets

(56) References Cited

U.S. PATENT DOCUMENTS

| | | |
|---|---|---|
| 2014/0097429 A1 | 4/2014 | Kim et al. |
| 2016/0029473 A1 | 1/2016 | Zang et al. |
| 2017/0148822 A1 | 5/2017 | Hu |
| 2017/0154943 A1 | 6/2017 | Yang et al. |
| 2018/0076411 A1 | 3/2018 | Kim |
| 2020/0075701 A1 | 3/2020 | Song et al. |
| 2020/0098841 A1 | 3/2020 | Song et al. |

FOREIGN PATENT DOCUMENTS

| | | |
|---|---|---|
| CN | 104867450 A | 8/2015 |
| CN | 105355634 A | 2/2016 |
| CN | 107731877 A | 2/2018 |
| CN | 108983506 A | 12/2018 |
| CN | 109256396 A | 1/2019 |
| CN | 109273498 A | 1/2019 |
| CN | 109360849 A | 2/2019 |

OTHER PUBLICATIONS

First Office Action in the Chinese Patent Application No. 201910282382.4 dated Dec. 24, 2019; English translation attached.
Second Office Action in the Chinese Patent Application No. 201910282382.4 dated Sep. 1, 2020; English translation attached.
SOG, (Silicon on Glass), https://baike.baidu.com/item/SOG/18152287?fr=aladdin, English translation attached.

SUBSTANTIALLY TRANSPARENT DISPLAY SUBSTRATE, SUBSTANTIALLY TRANSPARENT DISPLAY APPARATUS, AND METHOD OF FABRICATING SUBSTANTIALLY TRANSPARENT DISPLAY SUBSTRATE

CROSS-REFERENCE TO RELATED APPLICATION

This application is a national stage application under 35 U.S.C. §371 of International Application No. PCT/CN2019/102000, filed Aug. 22, 2019, which claims priority to Chinese Patent Application No. 201910282382.4, filed Apr. 9, 2019. Each of the forgoing applications is herein incorporated by reference in its entirety for all purposes.

TECHNICAL FIELD

The present invention relates to display technology, more particularly, to a substantially transparent display substrate, a substantially transparent display apparatus, and a method of fabricating a substantially transparent display substrate.

BACKGROUND

In present, various types of display apparatus can be found in people's daily life, including liquid crystal display apparatus, organic light emitting diode display apparatus, etc.

Substantially transparent display apparatus is also a type of display apparatus having a promising market potential, since the substantially transparent display apparatus is substantially transparent and can show the background of the display apparatus, which can provide a nice and special experience to users.

SUMMARY

In one aspect; the present invention provides a substantially transparent display substrate, comprising a base substrate; multiple insulating layers on the base substrate and in a display area attic substantially transparent display substrate; and a plurality of grooves in at least a first insulating layer of the multiple insulating layers, wherein at least one of the plurality of grooves at least partially extending into the first insulating layer; wherein the display area comprises a plurality of subpixel regions spaced apart from each other by an inter-subpixel region; a respective one of the plurality of subpixel regions comprises a light emitting sub-region and a substantially transparent subregion; and at least a portion of a respective one of the plurality of grooves is about an edge of the substantially transparent sub-region of the respective one of the plurality of subpixel regions.

Optionally, at least a first portion of the respective one of the plurality of grooves has a first elongated shape in plan view of the substantially transparent display substrate; and the first elongated shape has a length along a direction substantially parallel to a first edge of the substantially transparent sub-region of the respective one of the plurality of subpixel regions.

Optionally, the length of the first elongated shape per subpixel is at least 50% of a width or a length of the substantially transparent sub-region of the respective one of the plurality of subpixel regions.

Optionally, the first insulating layer is a layer selected from a group consisting of a buffer layer, an inter-layer dielectric layer, and a passivation layer.

Optionally, the respective one of the plurality of grooves is at lead partially in the inter-subpixel region.

Optionally, the respective one of the plurality of grooves is at least partially in the substantially transparent sub-region of the respective one of the plurality of subpixel regions.

Optionally, the respective one of the plurality of grooves crosses over an interface between the substantially transparent sub-region of the respective one of the plurality of subpixel regions and the inter-subpixel region.

Optionally, the respective one of the plurality of grooves substantially surrounds a perimeter of the substantially transparent sub-region of the respective one of the plurality of subpixel regions.

Optionally, the substantially transparent display substrate further comprises a plurality of first signal lines in the inter-subpixel region; wherein a respective one of the plurality of first signal lines is substantially parallel to, and extends over, substantially an entirety of the length of the first elongated shape.

Optionally, the respective one of the plurality of first signal lines is a gate line on a side of the first insulating layer away from the base substrate; the substantially transparent display substrate further comprises a data line on a side of the gate line away from the base substrate; and the data line crosses over the gate line forming an intersection in a region corresponding to the respective one of the plurality of grooves.

Optionally, the respective one of the plurality of first signal lines is a gate line on a side of the first insulating layer closer to the base substrate; the substantially transparent display substrate further comprises a data line on a side of the gate line away from the base substrate; a thickness of the at least the first insulating layer of the multiple insulating layers is greater than 0 in a region corresponding to the respective one of the plurality of grooves; and the data line crosses over the gate line forming an intersection in a region corresponding to the respective one of the plurality of grooves.

Optionally, the substantially transparent display substrate further comprises a plurality of second signal lines in the inter-subpixel region; at least a second portion of the respective one of the plurality of grooves has a second elongated shape in plan view of the substantially transparent display substrate; the second elongated shape has a length along a direction substantially parallel to a second edge of the substantially transparent sub-region of the respective one of the plurality of subpixel regions; and a respective one of the plurality of second signal lines is substantially parallel to, and extends over, substantially an entirety of the length of the second elongated shape.

Optionally, the plurality of first signal lines are arranged along a first direction, a respective one of which extending along a second direction different from the first direction; the plurality of second signal lines are arranged along the second direction, a respective one of which extending along the first direction; the plurality of grooves comprise a plurality of first signal lines groove portions and a plurality of second signal lines groove portions; a respective one of the plurality of first signal lines crosses over a region corresponding to a row, along the second direction, of the first signal line groove portions; and a respective one of the plurality of second signal lines crosses over a region corresponding to a column, along the first direction, of the second signal line groove portions.

Optionally, the multiple insulating layers comprises an inter-layer dielectric layer and a passivation layer; and, in the substantially transparent sub-region of the respective one of the plurality of subpixel regions, one or a combination of the inter-layer dielectric layer and the passivation layer is substantially absent, thereby forming at least a portion of a respective one of the plurality of grooves, the portion extending through one or the combination of the inter-layer dielectric layer and the passivation layer.

Optionally, the multiple insulating layer further comprises a planarization layer on a side of one or the combination of the inter-layer dielectric layer and the passivation layer away from the base substrate; wherein the planarization layer comprises a silicon-on-glass material; and an orthographic projection of the planarization layer an the base substrate covers the display area.

Optionally, the planarization layer comprises a first planarization sub-layer and a second planarization sub-layer on a side of the first planarization sub-layer away from the base substrate; the first planarization sub-layer comprises a resin material; and the second planarization sub-layer comprise a silicon-an-glass material.

Optionally, in the substantially transparent sub-region of the respective one of the plurality of subpixel regions, the inter-layer dielectric layer and the passivation layer are substantially absent; the planarization layer is present in the substantially transparent sub-region of the respective one of the plurality of subpixel regions; and a thickness of the planarization layer in the substantially transparent sub-region of the respective one of the plurality of subpixel regions is smaller than a combined thickness of the inter-layer dielectric layer and the passivation layer in the light emitting sub-region.

Optionally, at least a portion of the respective one of the plurality of grooves is in a region between two adjacent substantially transparent sub-regions.

Optionally, at least a portion of the respective one of the plurality of grooves is in a region between the light emitting sub-region and the substantially transparent sub-region in the respective one of the plurality of subpixel regions.

Optionally, at least a portion of the respective one of the plurality of grooves is in a region between the light emitting sub-region in the respective one of the plurality of subpixel regions and a substantially transparent sub-region adjacent to the light emitting sub-region in a subpixel region other than the respective one of the plurality of subpixel regions.

Optionally, at least a portion of the respective one of the plurality of grooves is in a diagonal region of the substantially transparent sub-region in the respective one of the plurality of subpixel regions.

Optionally, the plurality of grooves are arranged in array respectively in the plurality of subpixel regions.

In another aspect, the present invention provides a substantially transparent display apparatus, comprising the substantially transparent display substrate described herein or fabricated by a method described herein.

Optionally, the substantially transparent display apparatus further comprises a counter substrate on the substantially transparent display substrate; wherein the counter substrate comprises a color filter and a black matrix; the black matrix comprises a plurality of black matrix bars defining the plurality of light emitting sub-regions; the color filter is in the plurality of light emitting regions; and the black matrix covers a region corresponding to the plurality of grooves.

In another aspect, the present invention provides a method of fabricating a transparent display substrate, comprising proving a base substrate; forming multiple insulating layers on the base substrate and in a display area of the substantially transparent display substrate; and forming a plurality of grooves in at least a first insulating layer of the multiple insulating layer; wherein the display area comprises a plurality of subpixel regions spaced apart from each other by an inter-subpixel region; a respective one of the plurality of subpixel regions comprises a light emitting sub-region and a substantially transparent sub-region; at least one of the plurality of grooves are formed to at least partially extend into the first insulating layer, and at least a portion of a respective one of the plurality of grooves is formed about an edge of the substantially transparent sub-region of the respective one of the plurality of subpixel regions.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The mead disclosure provides, inter alia, a substantially transparent display substrate, a substantially transparent display apparatus, and a method of fabricating a substantially transparent display substrate that substantially obviate one or more of the problems due to limitations and disadvantages of the related art. In one aspect, the present disclosure provides a substantially transparent display substrate. In some embodiments, the substantially transparent display substrate includes a base substrate; multiple insulating layers on the base substrate and in a display area of the substantially transparent display substrate; and a plurality of grooves in at least a first insulating layer of the multiple inserting layer. Optionally, at least one of the plurality of grooves at least partially extends into the first insulating layer. Optionally, the display area includes a plurality of subpixel regions spaced apart from each other by an inter-subpixel region. Optionally, a respective one of the plurality of subpixel regions includes a light emitting sub-region and a substantially transparent sub-region. Optionally, at least a portion of the respective one of the plurality of grooves is about an edge of the substantially transparent sub-region of the respective one of the plurality of subpixel regions.

Figure 1:
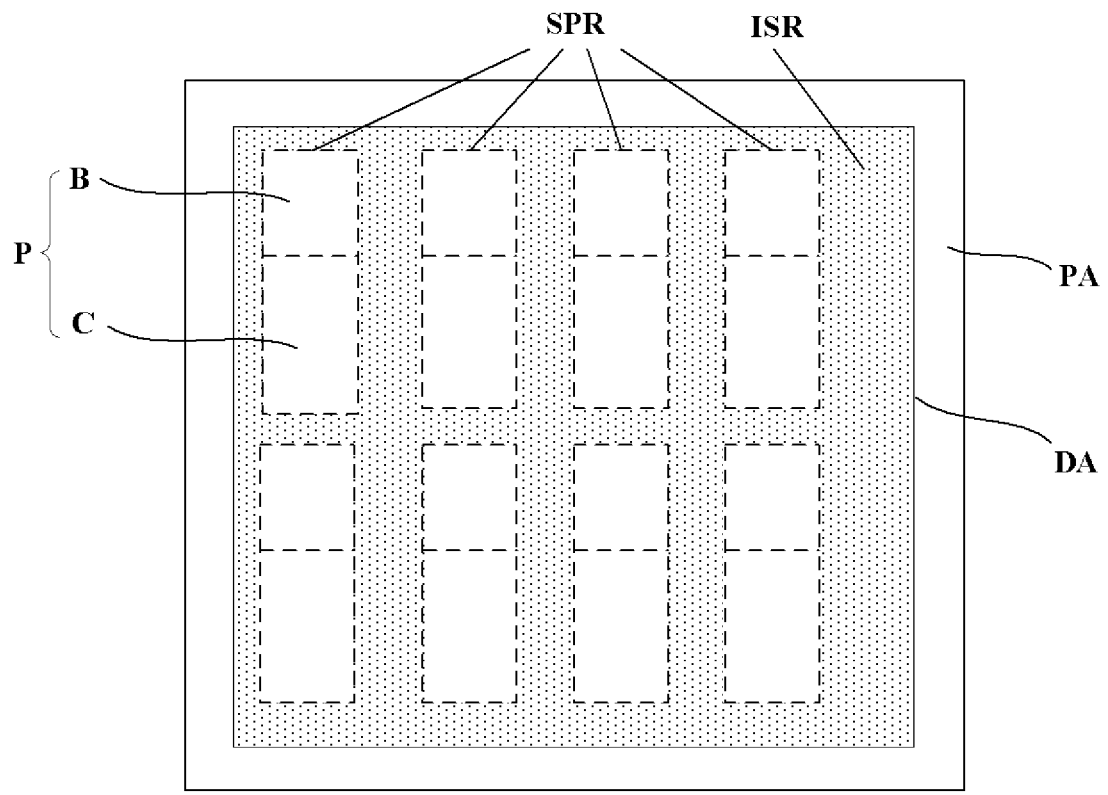
FIG. 1 is a plan view of a substantially transparent display substrate in some embodiments according to the present disclosure.

FIG. 1 is a plan view of a substantially transparent display substrate in some embodiments according to the present disclosure. Referring to FIG. 1, in some embodiments, the substantially transparent display substrate includes a display area DA and a peripheral area PA.

As used herein, the team "display area" refers to an area of the display substrate where image is actually displayed. Optionally, the display area may include both a subpixel region and an inter-subpixel region. A subpixel region includes a light emitting sub-region of a subpixel, such as a sub-region corresponding to a pixel electrode in a liquid crystal display or a region corresponding to a light emissive layer in an organic light emitting display. Optionally, the subpixel region further includes a substantially transparent sub-region, such as a sub-region configured to allow a user to see a background of the display substrate. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein, the term "peripheral area" refers to an area of a display substrate (e.g., an opposing substrate or an array substrate) in a display apparatus where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display area.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

In some embodiments, the display area DA includes a plurality of subpixel regions SPR spaced apart from each other by an inter-subpixel region ISR. Optionally, the substantially transparent display substrate in the display area DA includes a plurality of subpixels P. Optionally, the subpixels P are arranged in array. Optionally, a respective one of the plurality of subpixels P is in a respective one of the plurality of subpixel regions SPR.

As used herein, a subpixel region refers to a region comprising a light omission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. Optionally, a subpixel region further includes a substantially transparent sub-region allowing light from a background of the display substrate to transmit through the display substrate.

As used herein, an item-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, a respective one of the plurality of subpixel regions SPR includes a light emitting sub-region B and a substantially transparent sub-region C. Optionally, the respective one of the plurality of subpixels P in the respective one of the plurality of subpixel regions SPR also includes the light emitting sub-region B and the substantially transparent sub-region C.

As used herein, a light emitting sub-region refers to a sub-region of a subpixel region configured to emit light, such as a sub-region corresponding to a pixel electrode in a liquid crystal display or a region corresponding to a light emissive layer in an organic light emitting display.

As used herein, a substantially transparent sub-region refers to a sub-region of a subpixel region configured to allow light from a background of the display substrate to transmit through the display substrate, such as a sub-region substantially free of any light emitting elements and substantially non-transparent component (e.g., thin film transistors associated with the light emitting elements, signal lines, and other non-transparent layers or elements). Optionally, layers in the substantially transparent sub-region is substantially transparent, therefore the substantially transparent sub-region is also substantially transparent.

Various appropriate light emitting elements may be used herein. Examples of appropriate light emitting elements include OLED light emitting elements, and photoluminescent light emitting elements. Examples of appropriate light emitting elements further include top-emission type light emitting elements, type light emitting elements, dual-side-emission type light emitting elements, and etc.

Optionally, the light emitting sub-region B includes a top-emission type light emitting element and a pixel driving circuit configured to drive the light emitting element in the same light emitting sub-region B to perform color display.

In some embodiments, the substantially transparent display substrate includes a base substrate, and multiple insulating layers on the base substrate and in a display area of the substantially transparent display substrate.

Figure 2:
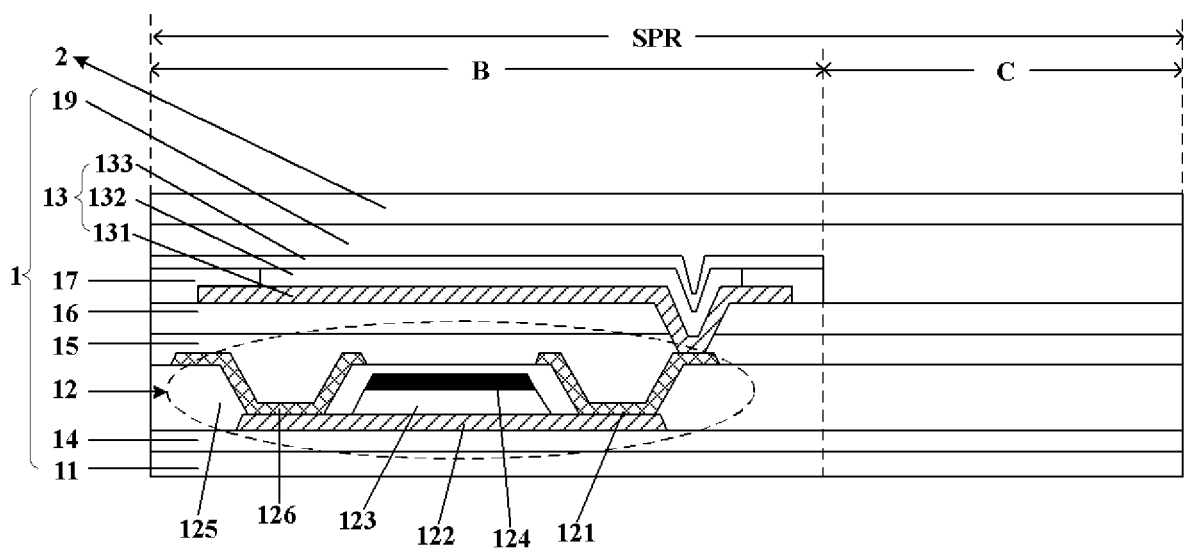
FIG. 2 is a cross-sectional view of a substantially transparent display substrate in some embodiments according to the present disclosure.

FIG. 2 is a cross-sectional view of a substantially transparent display substrate in some embodiments according to the present disclosure. Referring to FIG. 2, in some embodiments, the light emitting element 13 is a top-emission type light emitting element.

In some embodiments, a substantially transparent display apparatus described herein includes a substantially transparent display substrate 1 and a counter substrate 2. Optionally, the counter substrate 2 is a glass substrate.

In some embodiments, the substantially transparent display substrate 1 includes a base substrate 11. Optionally, the base substrate 11 is substantially transparent. Various appropriate materials may be used for making the base substrate. Examples of materials suitable for marring the base substrate include, but are not limited to, glass, quartz, polyimide, and polyester, etc. Optionally, the base substrate 11 is a flexible substantially transparent substrate.

In some embodiments, the top-emission type light emitting elements in the light emitting sub-region B includes a thin film transistor 12 which is a driving thin film transistor. A drain electrode 121 of the thin film transistor 12 is electrically connected to an anode 131 of the light emitting element 13.

Optionally, the thin film transistor 12 includes an active layer 122 an the base substrate 11, a gate insulating layer 123 on a side of the active layer 122 away from the base substrate 11, a gate electrode 124 on a side of the gate insulating layer 123 away from the base substrate 11, an inter-layer dielectric layer 125 on a side of the gate electrode 124 away from the base substrate 11, a source electrode 126 electrically connected to the active layer 122 through the inter-layer dielectric layer 125, and a drain electrode 121 electrically contacted to the active layer 122 through the inter-layer dielectric layer 125. Optionally, a buffer layer 14 is between the base substrate 11 and the thin film transistor 12.

Optionally, the light emitting element 13 includes the anode 131, a cathode 133, and a functional layer 132 between the anode 131 and the cathode 131. For example, the light emitting element 13 is the top emission type light emitting element, and the anode is non-transparent, and the cathode can be transparent, substantially transparent or non-transparent.

Various appropriate electrode materials and various appropriate fabricating methods may be used for forming the anode. Optionally, the anode may be formed using indium tin oxide (ITO) or nano-silver, for example the anode has a triple layer of ITO/Ag/ITO. Examples of appropriate methods for forming the anode include, but are not limited to, vapor deposition or sputtering.

Various appropriate electrode materials and various appropriate fabricating methods may be used for forming the cathode. Optionally, the cathode may be formed using nano-silver. Examples of appropriate methods for forming the cathode include, but are not limited to, vapor deposition or sputtering.

Optionally, the functional layer 132 includes a light emitting layer. Optionally, the functional layer 132 includes an election transporting layer (ETL), an election injection layer (EIL), a hole transporting layer (HTL), and a hole injection layer (HIL).

Figure 3:
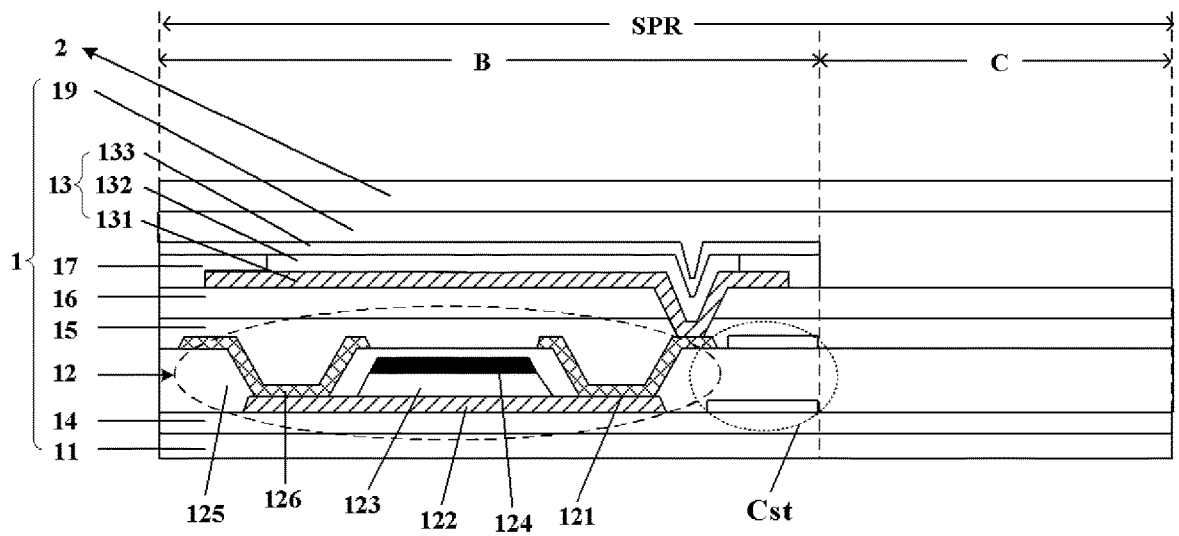
FIG. 3 is a cross-sectional view of a substantially transparent display substrate in some embodiments according to the present disclosure.
Figure 4:
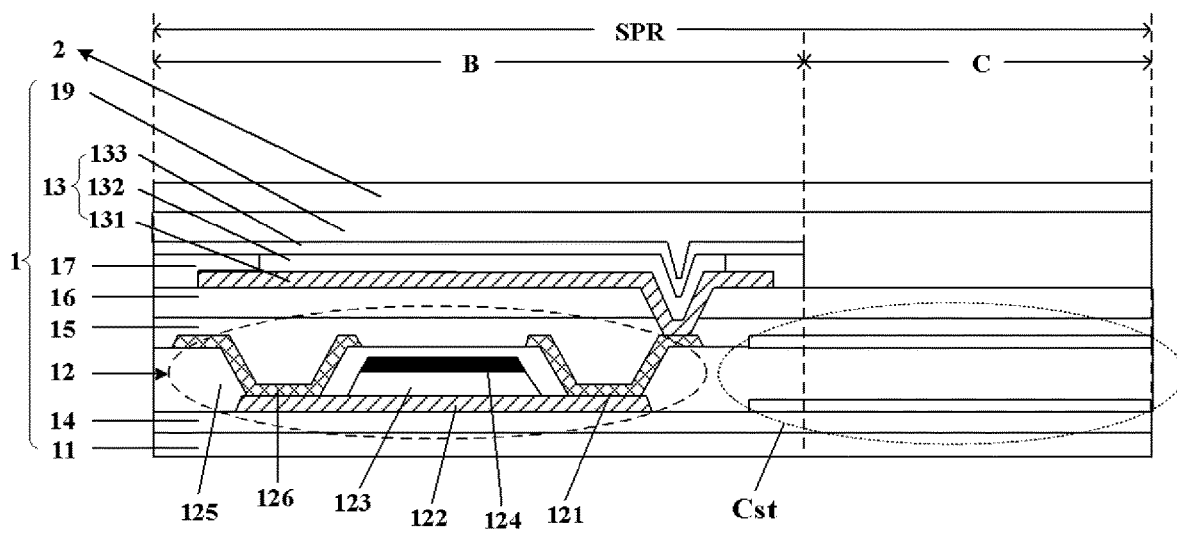
FIG. 4 is a cross-sectional view of a substantially transparent display substrate in some embodiments according to the present disclosure.

FIG. 3 is a cross-sectional view of a substantially transparent display substrate in some embodiments according to the present disclosure. FIG. 4 is a cross-sectional view of a substantially transparent display substrate in some embodiments according to the present disclosure. In some embodiments, referring to FIG. 3 and FIG. 4, the pixel driving circuit further includes a storage capacitor Cst having a first electrode and a second electrode. In one example, the storage capacitor Cst is in the light emitting sub-region B. In another example, the storage capacitor Cst is in the substantially transparent sub-region C, and the first electrode and the second electrode of the storage capacitor Cst are substantially transparent.

Optionally, the gate electrode 124 of the thin film transistor 12 is electrically connected to the first electrode oldie storage capacitor Cst. Optionally, the source electrode 126 of the thin film transistor 12 is electrically connected to the first electrode of the storage capacitor Cst, in order to apply a voltage signal to the thin film transistor. Optionally, multiple thin film transistors and the storage capacitor Cst together drive the light emitting element 13 to emit light and perform color display.

Referring to FIG. 2, in some embodiments, the substantially transparent display substrate 1 further include a passivation layer 15 and the planarization layer 16, both of which are between the thin film transistor 12 and the anode 131. Optionally, the passivation layer 15 includes an organic material. Optionally, the planarization layer 16 includes an organic material.

Referring to FIG. 2, in some embodiments, the substantially transparent display substrate 1 further includes a pixel definition layer 17 in the light emitting sub-region B. An aperture extends through the pixel definition layer 17. Optionally, a functional layer 132 is disposed in the aperture extending through the pixel definition layer 17. Optionally, the light emitting element 13 is disposed in the aperture extending through the pixel definition layer 17.

Referring to FIG. 2, in some embodiments, the substantially transparent display substrate 1 further includes an encapsulating layer 19. Optionally, the encapsulating layer 19 is an encapsulating film. Optionally, the encapsulating layer 19 is an encapsulating glass.

In order to improve the transparency of the substantially transparent display substrate, while ensuring a normal display performance of the display substrate, an area of the substantially transparent sub-region C can be maximized as much as possible, or the substantially transparent sub-region C should use materials having a high transparency.

Figure 5A:
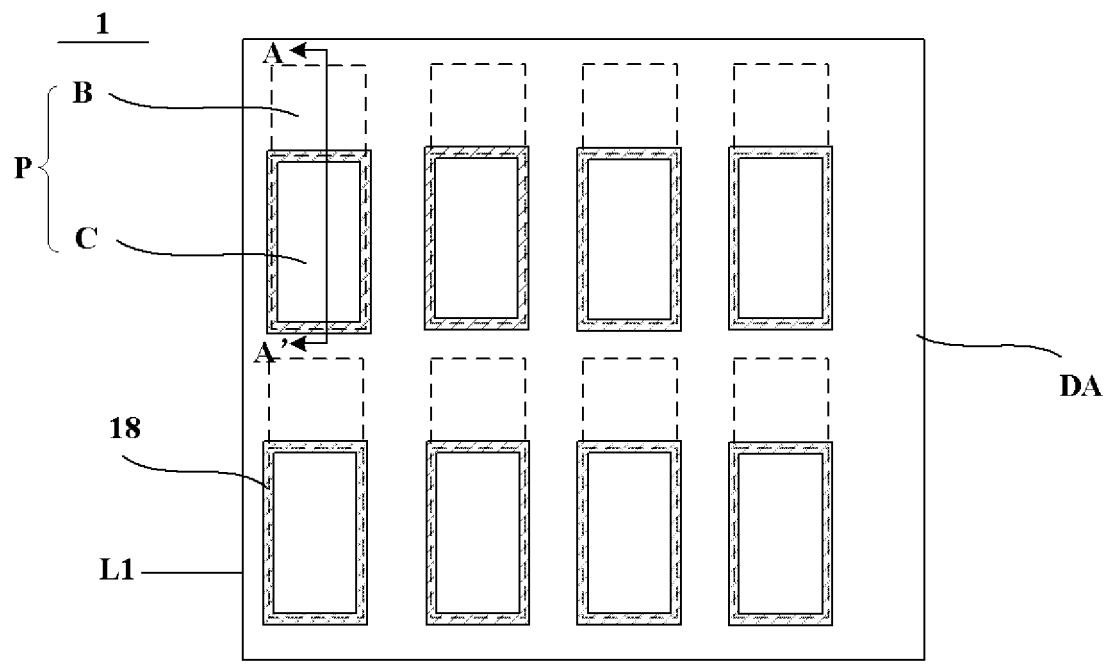
FIG. 5A is a plan view of a substantially transparent display substrate in some embodiments according to the present disclosure.
Figure 5B:
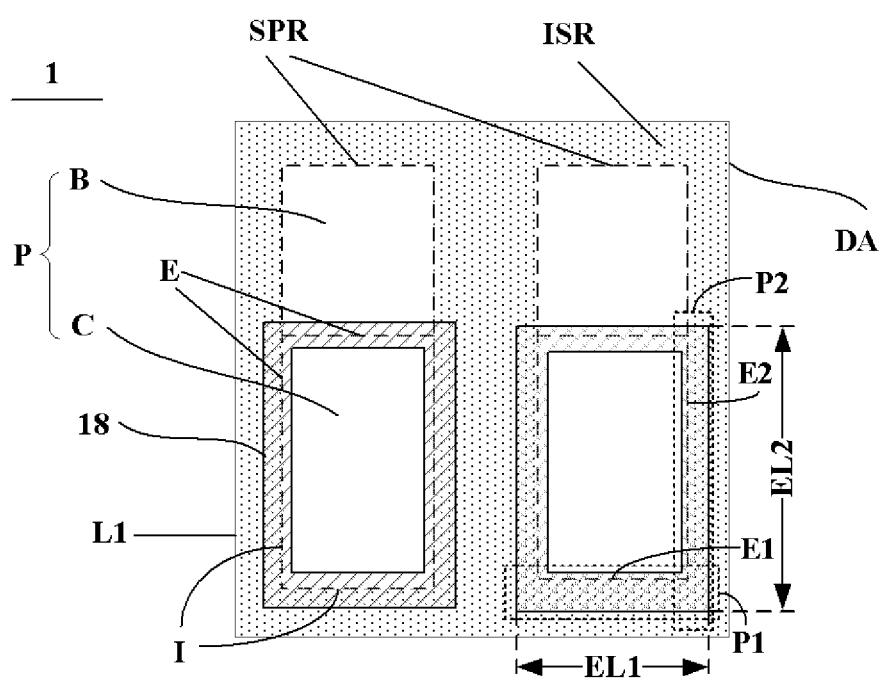
FIG. 5B is a plan view of a partial substantially transparent display substrate in some embodiments according to the present disclosure.
Figure 6:
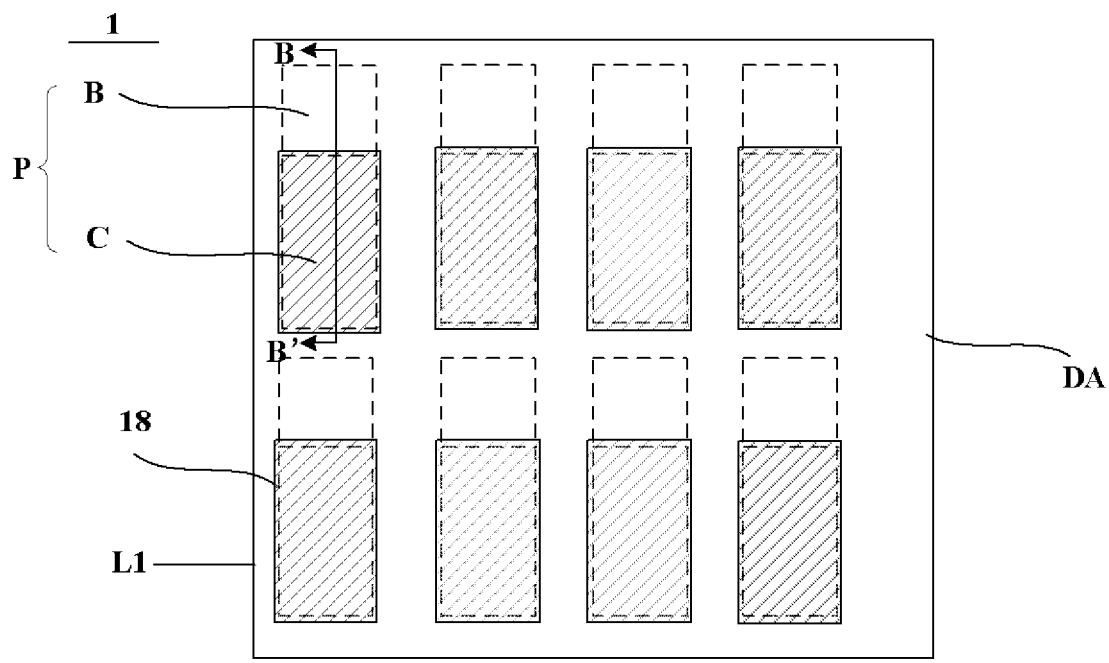
FIG. 6 is a plan view of a substantially transparent display substrate in some embodiments according to the present disclosure.
Figure 7:
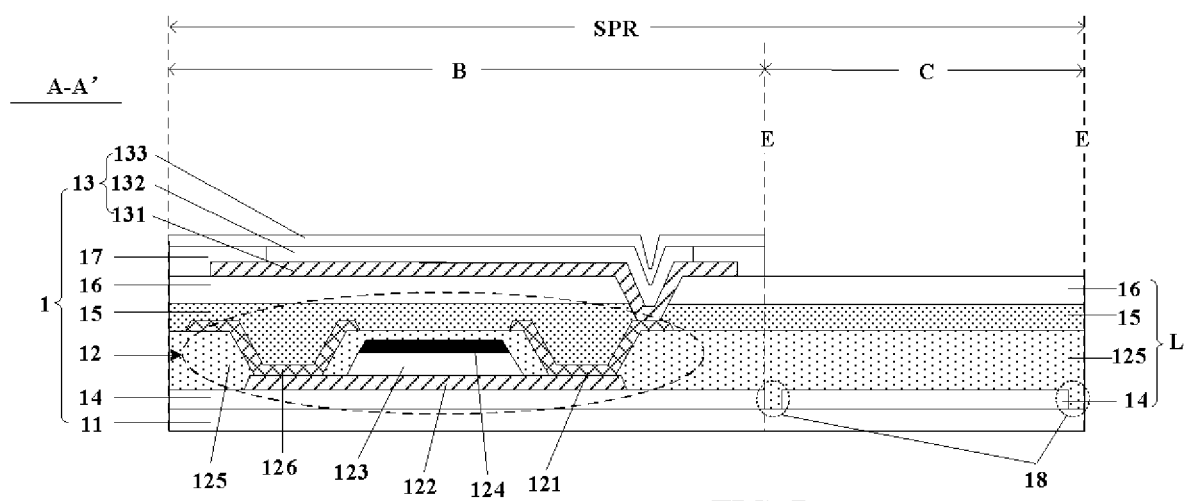
FIG. 7 is a cross-sectional view of the substantially transparent display substrate along an AA' direction in FIG. 5A.
Figure 8A:
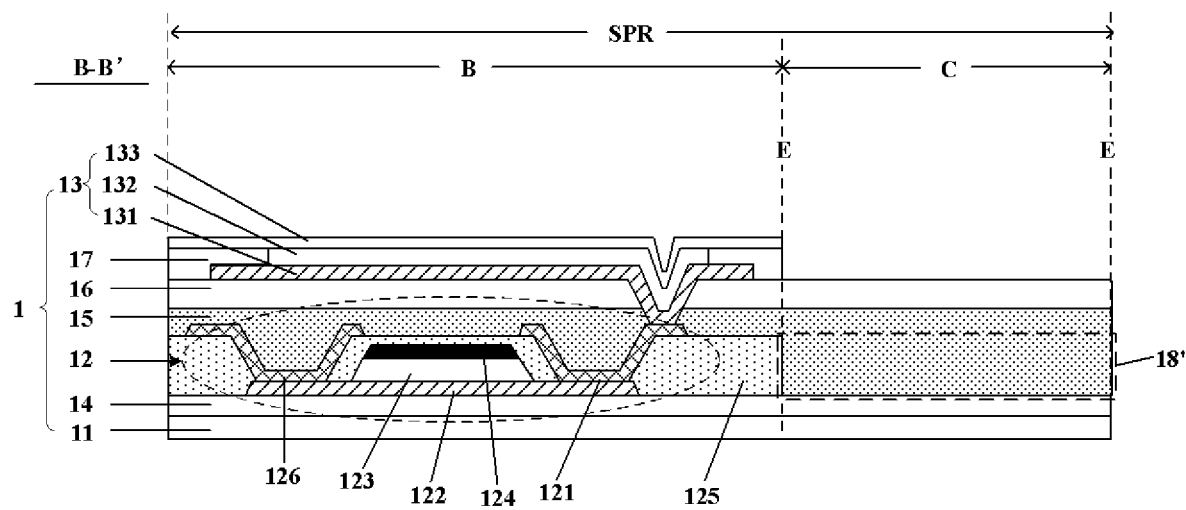
FIG. 8A is a cross-sectional view of the substantially transparent display substrate along a BB' direction in FIG. 6.

FIG. 5A is a plan view of a substantially transparent display substrate in some embodiments according to the present disclosure. FIG. 5B is a plan view of a partial substantially transparent display substrate in some embodiments according to the present disclosure. FIG. 6 is a plan view of a substantially transparent display substrate in some embodiments according to the present disclosure. FIG. 7 is a cross-sectional view of the substantially transparent display substrate along an AA' direction in FIG. 5A. FIG. 8A is a cross-sectional view of the substantially transparent display substrate along a BB' direction in FIG. 6.

Referring to FIG. 5A to FIG. 8A, in some embodiments, the substantially transparent display substrate 1 includes a plurality of grooves 18 in at least a first insulating layer L1 of the multiple insulating layers L. Optionally, referring to FIG. 7, the multiple insulating layers L includes, but are not limited to, the buffer layer 14, the inter-layer dielectric layer 125, the passivation layer 15, the planarization layer 16.

Optionally, referring to FIG. 5A to FIG. 8A, at least one of the plurality of grooves 18 at least partially extends into the first insulating layer L1. In one example, the respective one of the plurality of grooves 18 partially extends into the first insulating layer L1. In another example, the respective one of the plurality of grooves 18 extends through the first insulating layer L1, refining to FIG. 7, at least a portion of the respective one of the plurality of grooves 18 extends through the buffer layer 14 (e.g., the first insulating layer L1), and is about an edge of the substantially transparent subregion C of the respective one of the plurality of subpixel regions SPR.

Optionally, the multiple insulating layers L at least partially extends into the display area DA. Optionally, an insulating layer made of inorganic materials extends into the display area DA as well as the peripheral area PA. Optionally, an insulating layer made of organic materials extends only in the display area DA and absent from the peripheral area PA.

Referring to FIG. 5B, in some embodiments, at least a portion of the respective one of the plurality of grooves 18 is about an edge E of the substantially transparent sub-region C of the respective one of the plurality of subpixel regions SPR.

Optionally, the respective one of the plurality of grooves 18 is at least partially in the inter-subpixel region ISR. Optionally, the respective one of the plurality of grooves 18 is at least partially in the substantially transparent sub-region C of the respective one of the plurality of subpixel regions SPR. Optionally, the respective one of the plurality of grooves 18 crosses over an interface I between the substantially transparent sub-region C of the respective one of the plurality of subpixel regions SPR and the inter-subpixel region ISR.

Optionally, the respective one of the plurality of grooves 18 substantially surrounds a perimeter of the substantially transparent sub-region C of the respective one of the plurality of subpixel regions SPR.

By forming at least a portion of the respective one of the plurality of grooves 18 about the edge E of the substantially transparent sub-region C and extending into the first insulating layer L1, the stress borne by the first insulating layer L1 is reduced by the respective are of the plurality of grooves 18.

Figure 9:
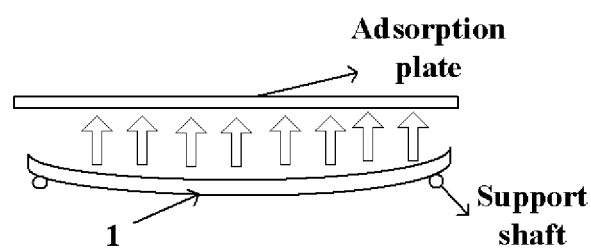
FIG. 9 is a schematic diagram illustrating a process of adsorbing a substantially transparent display substrate in some embodiments according to the present disclosure.

FIG. 9 is a schematic diagram illustrating a process of adsorbing a substantially transparent display substrate in some embodiments according to the present disclosure. Referring to FIG. 9, during a processing of encapsulating the substantially transparent display substrate 1 and a counter substrate, the substantially transparent display substrate 1 is adsorbed by an adsorption plate. When there is no groove described herein formed in any of the multiple insulating layers, a middle portion of the substantially transparent display substrate 1 bears a relatively high stress from the multiple insulating layers, so, the substantially transparent display substrate 1 is easily bent in the middle portion of the substantially transparent display substrate 1, which will have an adverse effect an the adsorption.

Referring to FIG. 5A to FIG. 8A, when the at least one of the plurality of grooves 18 at least partially extends into the first insulating layer L1, on one hand, the plurality of grooves can remove portions of the multiple insulating layers L, which can seduce the weight of the substantially transparent display substrate; on the other hand, by forming the at least one of the plurality of grooves 18, the first insulating layer L1 is divided into several portions by the plurality of grooves 18, the stress between the first insulating layer L1 can be reduced, so, the whole stress of the substantially transparent display substrate 1 is reduced, which can prevent the substantially transparent display substrate from being bent during the adsorption process, and ensures that process of encapsulating the substantially transparent display substrate 1 and the counter substrate is smoothly preformed.

Optionally, in at least one of the plurality of subpixel regions, one of the plurality of grooves at least partially extends into the first insulating layer, respectively, and at least a portion thereof is about an edge of the substantially transparent sub-region of the at least one of the plurality of subpixel regions. Optionally, the respective one of the plurality of grooves at least partially extends into the first insulating layer in the respective one of the plurality of subpixel regions, and at least a portion thereof is about an edge of the substantially transparent sub-region of the respective one of the plurality of subpixel regions.

Optionally, at least a portion of one of the plurality of grooves is about an edge of the substantially transparent sub-region. Optionally, one of the plurality of grooves is in the substantially transparent sub-region but away from the edge of the substantially transparent sub-region.

Optionally, at least a portion of at least one of the plurality of grooves is about an edge of the substantially transparent sub-region of the at least one of the plurality of subpixel regions but away from (e.g., spaced apart from) the edge of the substantially transparent sub-region. Optionally, at least one of the plurality of grooves is respectively in the substantially transparent sub-region of the at least one of the plurality of subpixel regions but away from (e.g., spaced apart from) the edge of the substantially transparent sub-region.

In some embodiments, the plurality of grooves 18 are in at least the first insulating layer of the multiple insulating layers. Optionally, one of the plurality of grooves 18 is in the N-th insulating layer of the multiple insulating layers (N is a positive integer). In one example, one of the plurality of grooves 18 is in the first insulating layer. In another example, one of the plurality of grooves 18 is in the second insulating layer. In another example, one of the plurality of grooves 18 is in the third insulating layer.

In some embodiments, at least one of the plurality of grooves 18 is at least partially extending into the first insulating layer. Optionally, one of the plurality of grooves 18 extends through the first insulating layer. Optionally, one of the plurality of grooves 18 extends through the first insulating layer and extends into another insulating layer between the first insulating layer and the base substrate.

In some embodiments, the plurality of grooves are in the first insulating layer of the multiple insulating layers, and at least a portion of the respective one of the plurality of grooves is about the edge of the substantially transparent sub-region C. For example, the first insulating layer is a layer selected from a group consisting of the buffer layer, the inter-layer dielectric layer, the passivation layer, and the planarization layer. By forming the plurality of grooves in the first insulating layer of the multiple insulating layer, the first insulating layer is divided into several portions by the plurality of grooves, the stress between the first insulating layer can be reduced, so, the whole stress of the substantially transparent display substrate is reduced, which can prevent the substantially transparent display substrate from being beat during the adsorption process, and ensures that process of encapsulating the substantially transparent display substrate 1 and the counter substrate is smoothly performed.

Referring to FIG. 7, for example, at least one of the plurality of grooves 18 extends through the buffer layer 14 (e.g., the first insulating layer L1) and at least a portion thereof is about the edge E of the substantially went sub-region C of the respective one of the plurality of subpixel regions SPR.

In some embodiments, the plurality of grooves are in at least two insulating layers of the multiple insulating layers. For example, the at least two insulating layers of the multiple insulating layers are different layer selected from the group consisting of the buffer layer, the inter-layer dielectric layer, the passivation layer, and the planarization layer. By forming the plurality of grooves in the least two insulating layers of the multiple insulating layers, the at least two insulating layers of the multiple insulating are divided into several portions by the plurality of grooves, the stress in the at least two insulating layers of the multiple insulating layers can be reduced, so, the whole stress of the substantially transparent display substrate is reduced, which can prevent the substantially transparent display substrate from being bent during the adsorption process, and ensures that process of encapsulating the substantially transparent display substrate and the counter substrate is smoothly performed.

Figure 10:
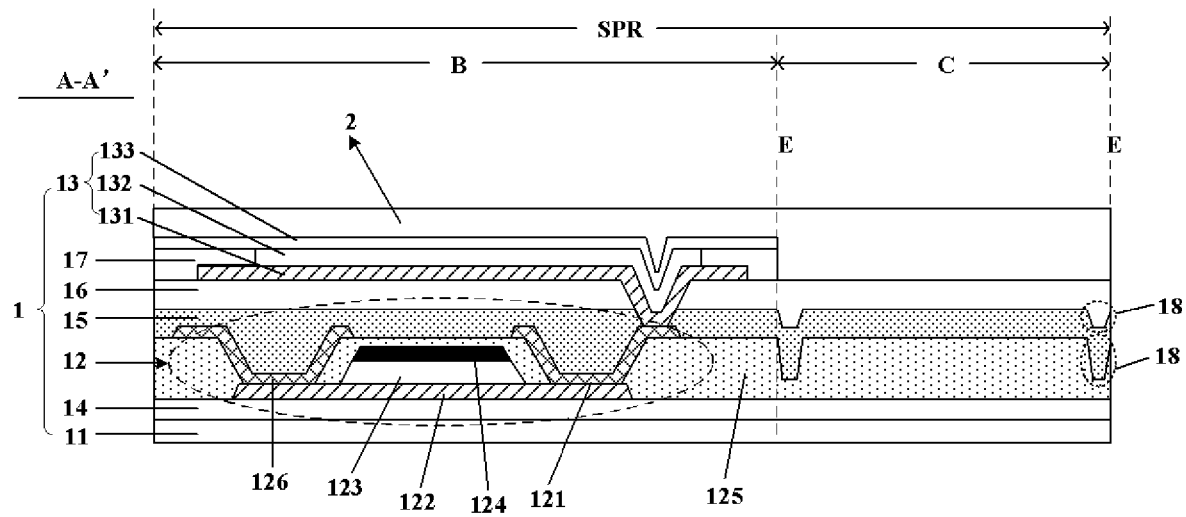
FIG. 10 is a cross-sectional view of the substantially transparent display substrate along an AA' direction in FIG. 5A.

Optionally, the plurality of grooves are in the first insulating layer and the second insulating layer of the multiple insulating layers. FIG. 10 is a cross-sectional view of the substantially transparent display substrate along an AA' direction in FIG. 5A. Referring to FIG. 10, the plurality of grooves 18 are in the inter-layer dielectric layer 125 (e.g., the first insulating layer) and the passivation layer 15 (e.g., the second insulating layer) of the multiple insulating layers.

In some embodiments, in the substantially transparent sub-region of the respective one of the plurality of subpixel regions, at least the first insulating layer of the multiple insulating layers is substantially absent to form at least a portion of the respective one of the plurality of grooves. Optionally, the portion of the respective one of the plurality of grooves in the substantially transparent sub-region extends through at least the first insulating layer of the multiple insulating layers. In some embodiments, the multiple insulating layers comprises an inter-layer dielectric layer, and a passivation layer. Optionally, in the substantially transparent sub-region of the respective one of the plurality of subpixel regions, one or a combination of the inter-layer dielectric layer and the passivation layer is substantially absent to form at least a portion of the respective one of the plurality of grooves. Optionally, the portion of the respective one of the plurality of grooves in the substantially transparent sub-region extends through one or the combination of the inter-layer dielectric layer and the passivation layer.

As used herein, the term "substantially absent" at least 50 percent (e.g., at least 60 percent, at least 70 percent, at least 80 percent, at least 90 percent, at least 95 percent, or 100 percent) of a region is not covered by a layer.

In some embodiments, in the substantially transparent sub-region of the respective one of the plurality of subpixel regions, the first insulating layer of the multiple insulating layers is substantially absent to form the portion of the respective one of the plurality of grooves. Optionally, the portion of the respective one of the plurality of grooves extends through the first insulating layer of the multiple insulating layers. For example, the first insulating layer is a layer selected from the group consisting of the buffer layer, the inter-layer dielectric layer, the passivation layer, and the planarization layer.

Optionally, a whole portion of the first insulating layer in the substantially transparent sub-region of the respective one of the plurality of subpixel regions are etched to form the portion of the respective one of the plurality of grooves. So, an insulating layer on a side of the first insulating layer closer to the base substrate is in direct contact with another insulating layer on a side of the first insulating layer away from the base substrate drop the portion of the respective one of the plurality of grooves.

Referring to FIG. 8A, optionally, the first insulating layer L1 is the inter-layer dielectric layer 125. In the substantially transparent sub-region of the respective one of the plurality of subpixel regions, the inter-layer dielectric layer 125 is substantially absent to form the portion 18' of the respective one of the plurality of grooves 18 extend through the inter-layer dielectric layer 125. Optionally, the passivation layer 15 and the buffer layer 14 are in direct contact with each other in the substantially transparent sub-region of the respective one of the plurality of subpixel regions. The area of the inter-layer dielectric layer 125 is reduced, and a weight of the substantially transparent display substrate 1 is also reduced, the stress in the inter-layer dielectric layer 125 is also reduced, so, the adsorption can be smoothly performed.

Figure 8B:
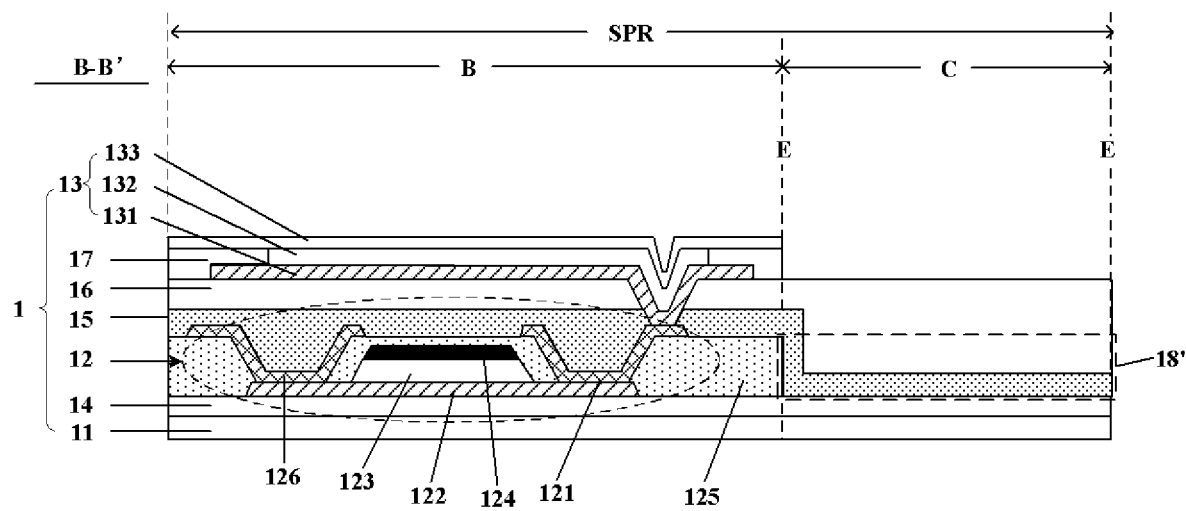
FIG. 8B is a cross-sectional view of the substantially transparent display substrate along a BB' direction in FIG. 6.

FIG. 8B is a cross-sectional view of the substantially transparent display substrate along a BB' direction in FIG. 6. Optionally, a thickness of a portion of the passivation layer 15 in the substantially transparent subregion C is substantially the same as a thickness of a portion of the passivation layer in the light emitting sub-region B. So, a normal height of a surface, away from the base substrate 11, of the portion of the passivation layer 15 in the substantially transparent sub-region C is shorter than a normal height of a surface, away from the base substrate 11, of the portion of the passivation layer 15 in the light emitting sub-region B away from the base substrate 11, and a transparency of the substantially transparent sub-region C can be increased.

As used herein, the tam "substantially the same" refers to a difference between two values not exceeding 10% of a base value (e.g., one of the two values), e.g., not exceeding 8% not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, in the substantially transparent sub-region of the respective one of the plurality of subpixel regions, at least the first insulating layer of the multiple insulating layers is substantially absent to form the portion of the respective one of the plurality of grooves. Optionally, the portion of the respective one of the plurality of grooves extends through the at least first insulating layer of the multiple insulating layers. For example, the first insulating layer of the multiple insulating layers is substantially absent, and the second insulating layer of the multiple insulating layers is substantially absent. And the first insulating layer and the second insulating layer are different layers selected from the group consisting of the buffer layer, the inter-layer dielectric layer, the passivation layer, and the planarization layer.

Figure 11A:
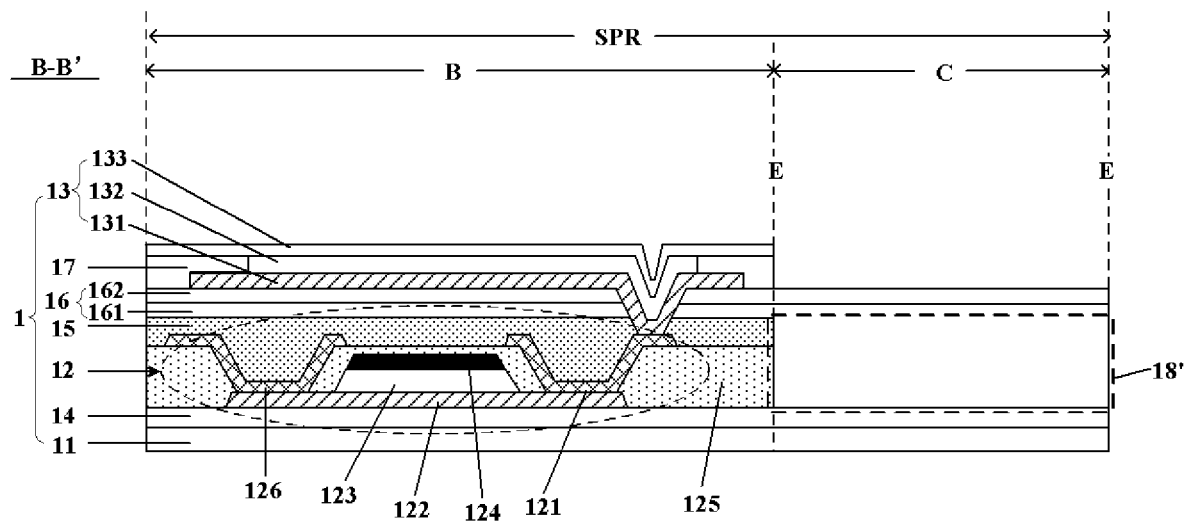
FIG. 11A is a cross-sectional view of the substantially transparent display substrate along a BB' direction in FIG. 6.

FIG. 11A is a cross-sectional view of the substantially transparent display substrate along a BB' direction in FIG. 6. Optionally, referring to FIG. 11A, in the substantially transparent sub-region of the respective one of the plurality of subpixel regions, the inter-layer dielectric layer 125 (e.g., the first insulating layer) and the passivation layer 15 (e.g., the second insulating layer) are absent to form the portion 18' of the respective one of the plurality of grooves 18 extends through the inter-layer dielectric layer 125 and the passivation layer 15. So, a whole portion of the inter-layer dielectric layer 125 in the substantially transparent sub-region and a whole portion of the passivation layer 15 in the substantially transparent sub-region are etched, and the area of the inter-layer dielectric layer 125 and the passivation layer 15 are reduced, the stress in the inter-layer dielectric layer 125 and the passivation layer 15 are also reduced, the weight of the substantially transparent display substrate are also reduced, the adsorption can be smoothly performed and the transparency of the substantially transparent display substrate can be improved.

Optionally, dry etching is used to etch the inter-layer dielectric layer 125. Optionally, over-etching may extend into the buffer layer 14, so, the buffer layer 14 can prevent the over-etching from extending into the base substrate 11, and prevent the display substrate from being contaminated.

In some embodiments, referring to FIG. 7 to FIG. 11A, the multiple insulating layer further includes a planarization layer 16. Optionally, the planarization layer 16 is on a side of the inter-layer dielectric layer 125 or the passivation layer 15 away from the base substrate 11. Optionally, referring to FIG. 11A, the planarization layer 16 covers an over-etched surface of the buffer layer 14.

Various appropriate materials and various appropriate fabricating methods may be used for making the planarization layer. Examples of materials used for making the planarization layer include, but are not limited to silicon-on-glass (SOG) material, and polydimethylsiloxane (PDMS). For example, a planarization material may be deposited by a plasma-enhanced chemical vapor deposition (PECVD) process or a sputtering process, e.g., a magnetron sputtering process. Optionally, the deposited planarization material layer has a thickness in a range of approximately 100 nm to approximately 300 nm. The deposited planarization material layer is then patterned, e.g., by a lithographic process. Examples of appropriate metal materials for making the planarization layer include conductive polymer materials such as PEDOT:PSS.

As used herein, the tam "silicon-on-glass material" refers to a laminate material formed by mechanically or chemically banding silicon (e.g., single crystalline silicon, polycrystalline silicon, porous silicon) to glass. By using the silicon glass material for forming the planarization layer 16, the issue of surface route of the planarization layer can be solved.

Figure 11B:
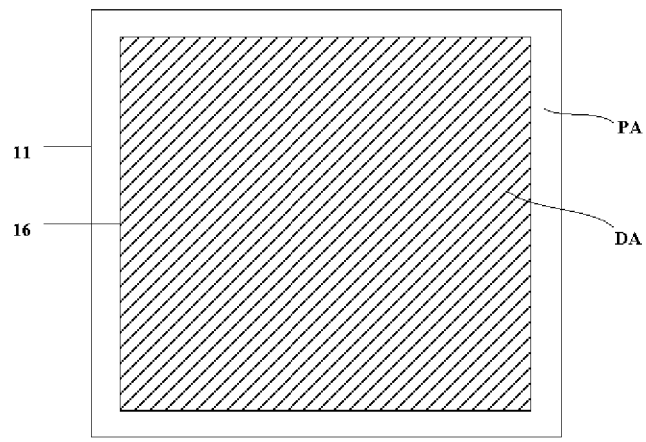
FIG. 11B is a plan view of a planarization layer in a substantially transparent display substrate in some embodiments according to the present disclosure.

FIG. 11B is a plan view of a planarization layer in a substantially transparent display substrate in some embodiments according to the preset disclosure. Optionally, an orthographic projection of the planarization layer 16 is on the base substrate 11 covers the display area DA.

Optionally, referring to both FIG. 7 and FIG. 10, a thickness of the planarization layer 16 is in a range of 0.15 µm to 0.25 µm, e.g., 0.15 µm to 0.17 µm, 0.17 µm to 0.19 µm, 0.19 µm to 0.21 µm, 0.21 µm to 0.23 µm, and 0.23 µm to 0.25 µm. For example, a thickness of the planarization layer 16 can be formed as small as possible, which can reduce the whole stress of the substantially transparent display substrate 1, and improve the transparency of the substantially transparent display substrate 1.

Optionally the planarization layer 16 has a single layer. Optionally, the planarization layer 16 has multiple layers. Referring to FIG. 11A, optionally, the planarization layer 16 include a first planarization sub-layer 161 an a side of the passivation layer 15 away from the base substrate 11 and a second planarization sub-layer 162 on a side of the first planarization sub-layer 161 away from the base substrate 11. In one example, the first planarization sub-layer 161 includes a resin material. In another example, the second planarization sub-layer 162 includes a silicon-on-glass (SOG) material. By adding the second planarization sub-layer 162 having the silicon-on-glass (SOG) material, micropores formed on the surface of the first planarization sub-layer 161 are filled with the second planarization sub-layer 162, which may also solve the problem of short between the anode 131 and the cathode 133 caused by the micropores an the surface of the first planarization sub-layer 161. Also, the thickness of the second affixation sub-layer 162 can be formed as thin as possible to reduce the whole stress of the substantially transparent display substrate 1, and to improve the transparency of the substantially transparent display substrate 1.

Optionally, a sum of a thickness of the first planarization sub-layer 161 and a thickness of the second planarization sub-layer 162 is in a range of 0.4 µm and 0.6 µm, e.g., 0.4 µm and 0.45 µm, 0.45 µm and 0.5 µm, 0.5 µm and 0.55 µm, or 0.55 µm and 0.6 µm.

Figure 11C:
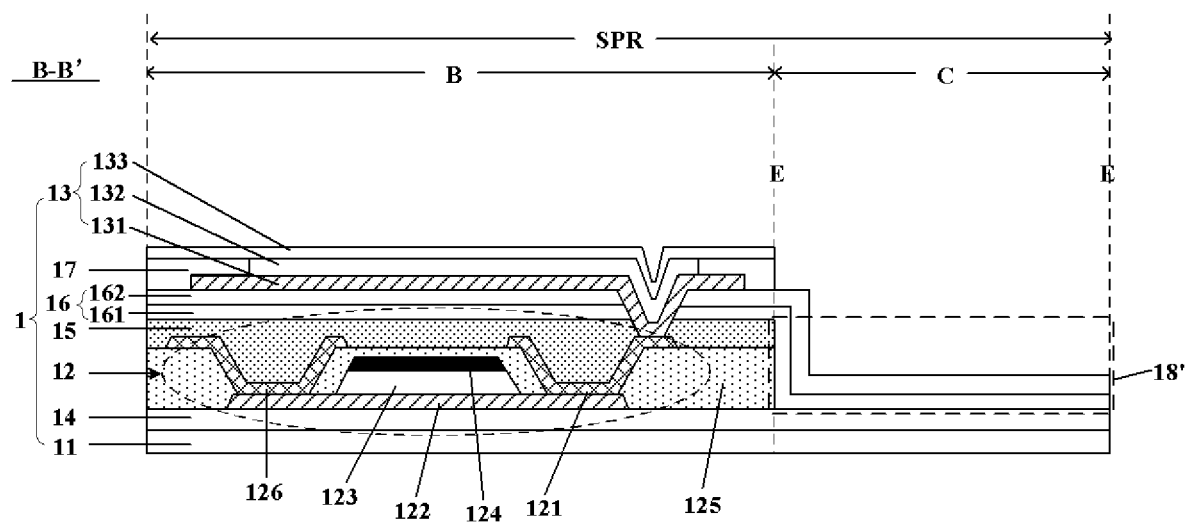
FIG. 11C is a cross-sectional view of the substantially transparent display substrate along a BB' direction in FIG. 6.

FIG. 11C is a cross-sectional view of the substantially transparent display substrate along a BB' direction in FIG. 6. Referring to FIG. 11C, in some embodiments, in the substantially transparent sub-region C of the respective one of the plurality of subpixel regions SPR, the inter-layer dielectric layer 125 and the passivation layer 15 are substantially absent; and the planarization layer 16 is present in the substantially transparent sub-region C of the respective one of the plurality of subpixel regions SPR. Optionally, a thickness of the planarization layer 16 in the substantially transparent sub-region C of the respective one of the plurality of subpixel regions SPR is smaller than a combined thickness of the inter-layer dielectric layer 125 and the passivation layer 15 in the light emitting sub-region B. In one example, the combined thickness of the inter-layer dielectric layer 125 and the passivation layer 15 in the light emitting sub-region B is equal to or greater than 0.8 µm, and the thickness of the planarization layer 16 in the substantially transparent sub-region C of the respective one of the plurality of subpixel regions SPR is smaller than 0.8 µm. In another example, the thickness of the planarization layer 16 in the substantially transparent sub-region C of the respective one of the plurality of subpixel regions SPR is in a range of 0 µm to 0.7 µm, e.g., 0 µm to 0.2 µm, 0.2 µm to 0.4 µm, 0.4 µm to 0.6 µm, 0.6 µm to 0.7 µm. By having a relatively thinner planarization layer 16 in the substantially transparent sub-region C, light transmission rate in the substantially transparent sub-region C can be further enhanced.

In some embodiments, referring to FIG. 5A and FIG. 5B, at least a first portion P1 of the respective use of the plurality of groves 18 has a first elongated shape in plan view of the substantially transparent display substrate 1. Optionally, the first elongated shape has a length EL1 along a direction substantially parallel to a first edge E1 of the substantially transparent sub-region C of the respective one of the plurality of subpixel region SPR. Optionally, the first portion P1 of the respective one of the plurality of grooves 18 is a continuous groove portion.

As used herein, the term "elongated shape" refers to a shape having a first length along one direction longer than a second length along another direction, the one direction and the another direction are two different direction. For example, the first length of the elongated shape along the one direction is twice or more longer than a length of the elongated shape along the another direction. In one case, the direction corresponding to a longer dimension may be referred to as a lengthwise direction, whereas the direction corresponding to a shorter dimension may be referred to as a widthwise direction.

In some embodiments, the length EL1 of the first elongated shape per subpixel is at least 10% (e.g., at least 20%, at least 30%, at least 40%, at least 50%, at least 60%, at least 70%, at least 80%, at least 90%, at least 95%, at lead 99%, or 100%) of the width of the substantially transparent sub-region C of the respective one of the plurality of subpixel regions SPR. Optionally, the length EL1 of the first elongated shape per subpixel is at least 50% of a width of the substantially transparent sub-region C of the respective one of the plurality of subpixel regions SPR In some embodiments, the length EL1 of the first elongated shape per subpixel is at least 10% (e.g., at least 20%, at least 30%, at least 40%, at least 50%, at least 60%, at least 70%, at least 80%, at least 90%, at least 95%, at least 99%, or 100%) of the length of the substantially transparent sub-region C of the respective one of the plurality of subpixel region SPR. Optionally, the length EL1 of the first elongated shape per subpixel is at least 50% of a length of the substantially transparent sub-region C of the respective one of the plurality of subpixel regions SPR In some embodiments, at least a second portion P2 of the respective one of the plurality of grooves 18 has a second elongated shape in plan view of the substantially transparent display substrate 1. Optionally, the second elongated shape has a length EL2 along a direction substantially parallel to a second edge E2 of the substantially transparent sub-region C of the respective one of the plurality of subpixel regions SPR. Optionally, the second portion P2 of the respective one of the plurality of grooves 18 is a continuous groove portion.

Figure 5C:
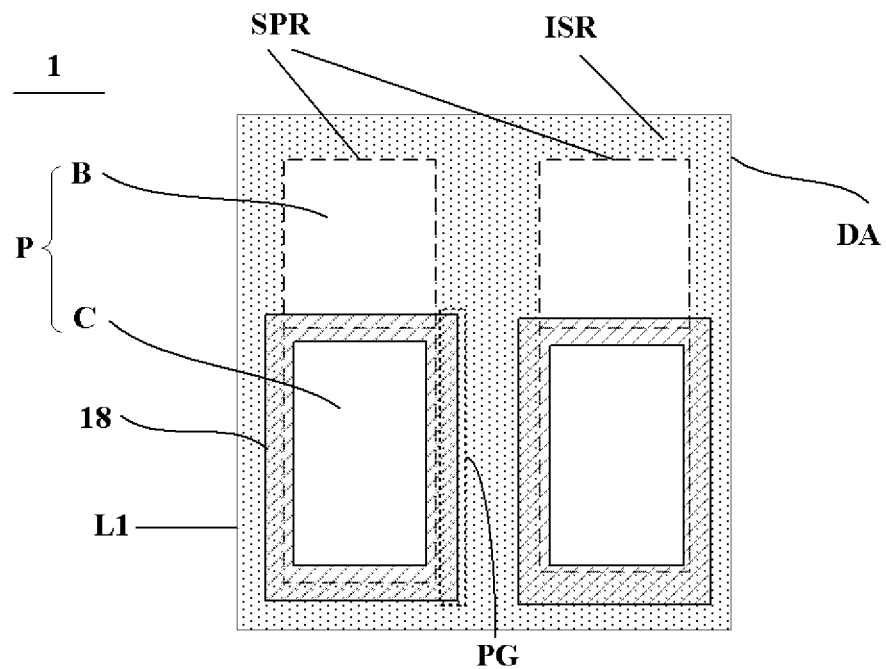
FIG. 5C is a plan view of a partial substantially transparent display substrate in some embodiments according to the present disclosure.

In some embodiments, the length EL2 of the second elongated shape pa subpixel is at least 10% (e.g., at least 20%, at least 30%, at least 40%, at least 50%, at least 60%, at least 70%, at least 80%, at least 90%, at least 95%, at least 99%, or 100%) of the width of the substantially transparent sub-region C of the respective one of the plurality of subpixel regions SPR. Optionally, the length EL2 of the second elongated shape per subpixel is at least 50% of a width of the substantially transparent sub-region C of the respective one of the plurality of subpixel regions SPR In some embodiments, the length EL1 of the second elongated shape per subpixel is at least 10% (e.g., at least 20%, at least 30%, at least 40%, at least 50%, at least 60%, at least 70%, at least 80%, at least 90%, at least 95%, at least 99%, or 100%) of the length of the substantially transparent sub-region C of the respective one of the plurality of subpixel regions SPR. Optionally, the length EL2 of the second elongated shape per subpixel is at least 50% of a length of the substantially transparent sub-region C of the respective one of the plurality of subpixel regions SPR FIG. 5C is a plan view of a partial substantially transparent display substrate in some embodiments according to the present disclosure. In some embodiments, referring to FIG. 5A and FIG. 5C, at least a portion PG of the respective one of the plurality of grooves 18 is in a region between two adjacent substantially transparent sub-regions.

Figure 5D:
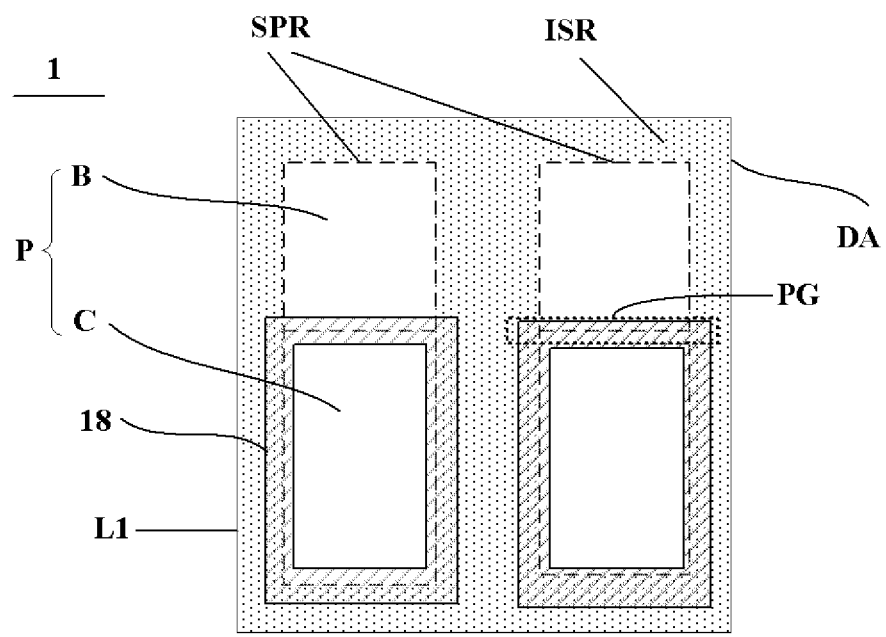
FIG. 5D is a plan view of a partial substantially transparent display substrate in some embodiments according to the present disclosure.

FIG. 5D is a plan view of a partial substantially transparent display substrate in some embodiments according to the present disclosure. In some embodiments, referring to FIG. 5A and FIG. 5D, at least a portion PG of the respective one of the plurality of grooves 18 is in a region between the light emitting sub-region and the substantially transparent sub-region in the respective one of the plurality of subpixel regions SPR.

Figure 5F:
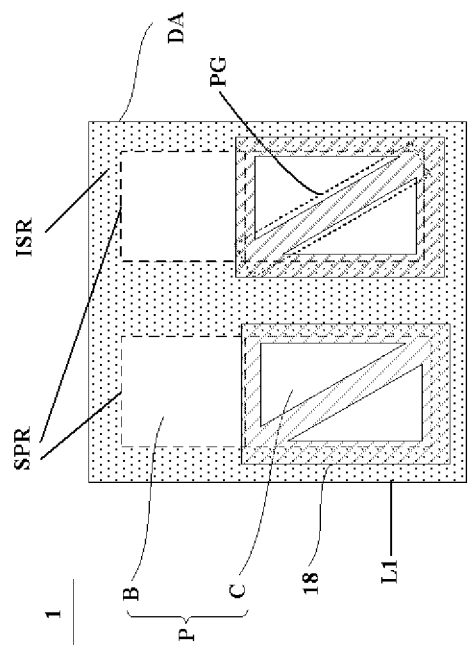
FIG. 5F is a plan view of a partial substantially transparent display substrate in some embodiments according to the present disclosure.
Figure 5E:
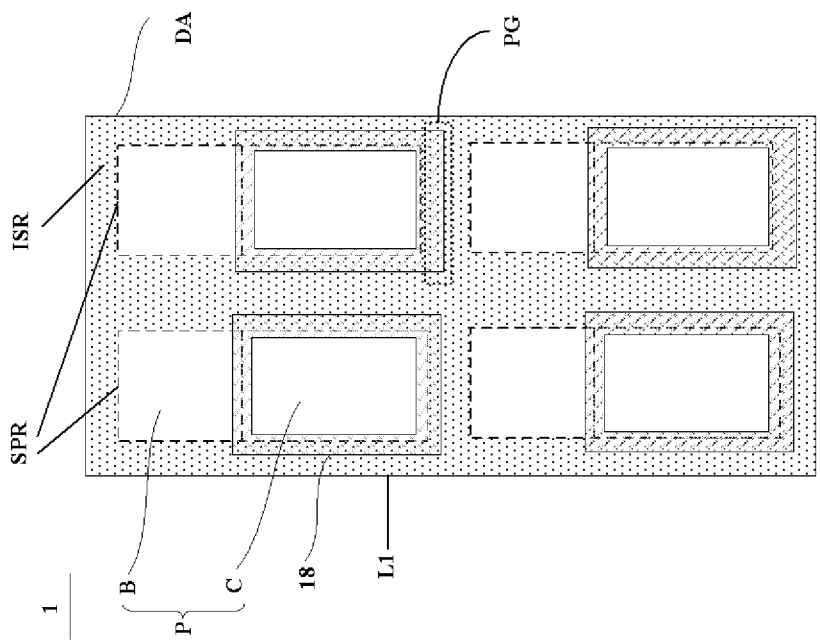
FIG. 5E is a plan view of a partial substantially transparent display substrate in son embodiments according to the present disclosure.

FIG. 5E is a plan view of a partial substantially transparent display substrate in some embodiments according to the present disclosure. In some embodiments, referring to FIG. 5A and FIG. 5E, at least a portion PG of the respective one of the plurality of grooves 18 is in a region between the light emitting sub-region B in the respective one of the plurality of subpixel regions SPR and a substantially transparent sub-region C adjacent to the light emitting sub-region in a subpixel region other than the respective one of the plurality of subpixel regions SPR.

FIG. 5F is a plan view of a partial substantially transparent display substrate in some embodiments according to the present disclosure. In some embodiments, referring to FIG. 5A and FIG. 5F, at least a portion PG of the respective one of the plurality of grooves 18 is in a diagonal region of the substantially transparent sub-region C in the respective one of the plurality of subpixel regions SPR.

In some embodiments, referring to FIG. 5A, the plurality of grooves 18 are arranged in array respectively in the plurality of subpixel regions SPR.

In some embodiments, the substantially transparent display substrate includes a plurality of first signal lines in the inter-subpixel region. Optionally, a respective one of the plurality of first signal lines is substantially parallel to, and extends over, substantially an entirety of the length of the first elongated shape.

As used herein, the term "substantially an entirety" refers to at least 80% of a basic value, e.g., at least 80%, at least 85%, at least 90%, at least 95%, at least 99%, or 100% of the basic value. For example, the respective one of the plurality of first signal lines extends over at least 80% of the length of the first elongated shape.

In some embodiments, the substantially transparent display substrate includes a plurality of second signal lines in the inter-subpixel region. Optionally, a respective one of the plurality of second signal lines is substantially parallel to, and extends over substantially an entirety of the length of the second elongated shape.

Figure 12:
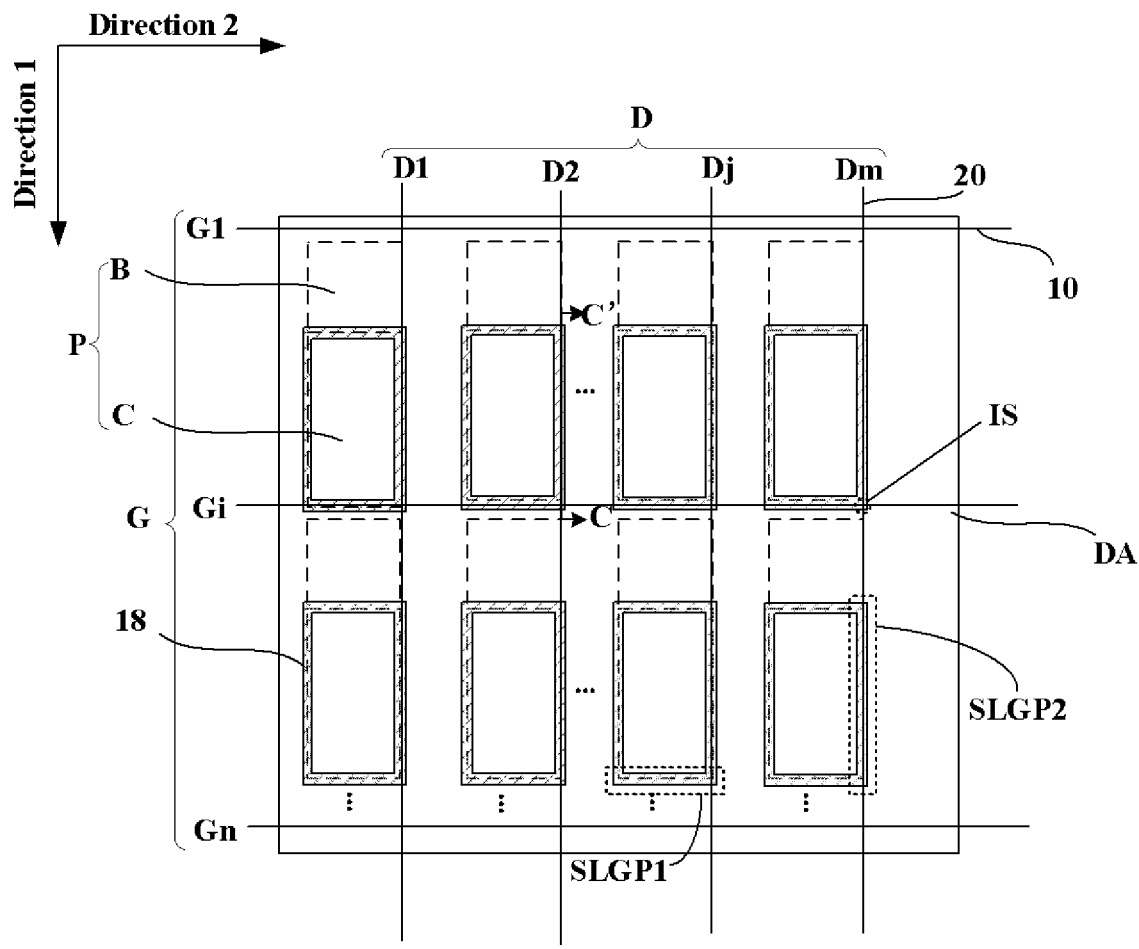
FIG. 12 is a plan view of a substantially transparent display substrate in some embodiments according to the present disclosure.

FIG. 12 is a plan view of a substantially transparent display substrate in some embodiments according to the present disclosure. In some embodiments, referring to FIG. 12, the respective one of the plurality of first signal lines G is a gate line 10. Optionally, the respective one of the plurality of second signal lines D is a data line 20.

Optionally, referring to FIG. 12 and FIG. 5B, a respective one of the plurality of gate lines (e.g., the respective one of the plurality of first signal lines G) is substantially parallel to, and extends over, substantially an entirety of the length EL1 of the first elongated shape (e.g., the first portion P1 of the respective one of the plurality of grooves 18).

Optionally referring to FIG. 12 and FIG. 5B, a respective one of the plurality of date lines (e.g., the respective one of the plurality of second signal lines D) is substantially parallel to, and extends over, substantially an entirety of the length EL2 of the second elongated shape (e.g., the second portion P2 of the respective one of the plurality of grooves 18).

In some embodiments, referring to FIG. 12, the plurality of first signal lines G are arranged along a first direction (Direction 1), and a respective one of the plurality of first signal lines G extends along a second direction (Direction 2) different from the first direction. Optionally, the plurality of second signal lines D are arranged along the second direction, and a respective one of the plurality of second signal lines D extends along the first direction. Optionally, the first direction and the second direction are different directions.

In some embodiments, the plurality of grooves 18 includes a plurality of first signal lines groove portions SLGP1 and a plurality of second signal lines groove portions SLGP2. Optionally, the plurality of first signal lines groove portions SLGP1 are arranged in a plurality of rows. Optionally, the plurality of second signal lines groove portions SLGP2 are arranged in a plurality of columns. Optionally, a row of multiple first signal lines groove portions of the plurality of first signal lines groove portions SLGP1 are arranged along the second direction. Optionally, a column of multiple second signal lines groove portions of the plurality of second signal lines groove portions SLGP2 are arranged along the first direction. Optionally, a respective one of the plurality of first signal lines G crosses over a region corresponding to a row, along the second direction, of the first signal line groove portions. Optionally, a respective one of the plurality of second signal lines D crosses over a region corresponding to a column, along the first direction, of the second signal line groove portions.

Figure 13:
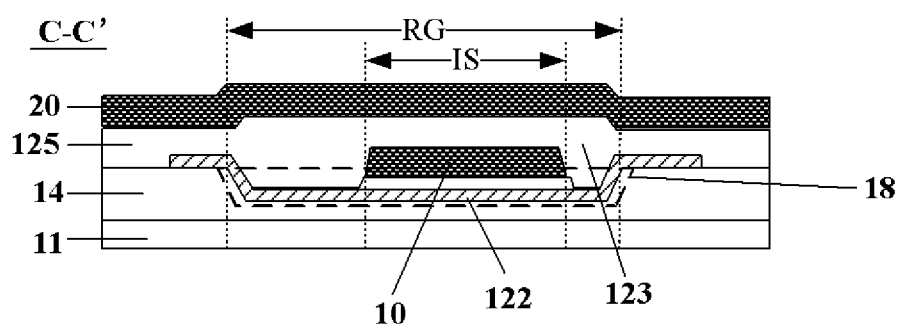
FIG. 13 is a cross-sectional view of the substantially transparent display substrate along a CC' direction in FIG. 12.

FIG. 13 is a cross-sectional view of the substantially transparent display substrate along a CC' direction in FIG. 12. In some embodiments, referring to FIG. 5B, FIG. 12, and FIG. 13, the respective one of the plurality of first signal lines G is a gate line 10. Optionally, the respective one of the plurality of second signal lines D is a data line 20. Optionally, the data line 20 crosses over the gate line 10 to form an intersection IS in a region corresponding to the respective one of the plurality of grooves 18.

In some embodiments, the first insulating layer of the multiple insulating layers is on a side of the plurality of first signal lines closer to the base substrate. Optionally, at least the first insulating layer of the multiple insulating layers is on a side of the plurality of first signal lines closer to the base substrate. Referring to FIG. 13, the gate line 10 (e.g., the respective one of the plurality of first signal lines G) is on a side of the first insulating layer away from the base substrate 11, and the data line 20 (e.g., the respective one of the plurality of second signal lines S) is on a side of the gate line away from the base substrate 11.

Optionally referring to FIG. 12 and FIG. 13, at least one of the plurality of grooves 18 at least partially extends into the buffer layer 14 (e.g., the first insulating layer). Optionally, the respective one of the plurality of second signal lines D (e.g., the data line 20) crosses over a corresponding first signal line G (e.g., the gate line 10) to form an intersection in a region RG corresponding to one of the plurality of grooves 18.

Optionally, one of the plurality of grooves 18 partially extends into the buffer layer 14. A thickness of the buffer layer 14 in a region corresponding to the one of the plurality of grooves is greater than zero. Optionally, one of the plurality of grooves 18 extends through the buffer layer 14. The thickness of the buffer layer 14 in the region corresponding to the one of the plurality of grooves is zero.

Referring to FIG. 12 and FIG. 13, the gate line 10 crosses over a region corresponding to a row, along the second direction, of the first signal line groove portions SLGP1, and the data line 20 crosses over a region corresponding to a column, along the first direction, of the second signal line groove portions SLGP2. Since the gate line 10 can extends into the first signal line grooves portions, when the data line 20 crosses over the gate line 10, in the intersection IS between the gate line 10 and the data line 20, the data line will climb a relatively low step, which makes the climbing of the data line 20 more easier, and also effectively reduce the step difference between different layers in the substantially transparent display substrate 1 to allow the planarization layer easily famed on the multiple layers in the substantially transparent display substrate 1.

In some embodiments, the first insulating layer of the multiple insulating layers is on a side of the plurality of first signal lines away from the base substrate. Optionally, at least the first insulating layer of the multiple insulating layers is on a side of the plurality of first signal lines away from the base substrate. Optionally, a thickness of one of the at least the first insulating layer of the multiple insulating layers is greater than 0 in a region corresponding to the respective one of the plurality of grooves.

Figure 14:
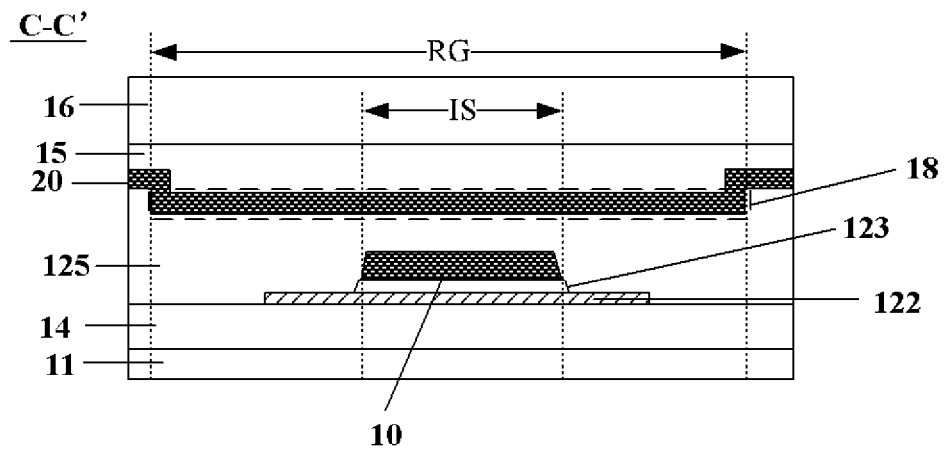
FIG. 14 is a cross-sectional view of the substantially transparent display substrate along a CC' direction in FIG. 12.

FIG. 14 is a cross-sectional view of the substantially transparent display substrate along a CC' direction in FIG. 12. In some embodiments, referring to FIG. 12 and FIG. 14, a gate line 10 (e.g., the respective one of the plurality of first signal lines G) is on a side of the first insulating layer away from the base substrate 11. Optionally, a data line 20 (e.g., the respective one of the plurality of second signal lines D) is on a side of the gate line 10 away from the base substrate 11.

Referring to FIG. 12 and FIG. 14, for example, one of the plurality of grooves 18 partially extends into the inter-layer dielectric layer 125 (e.g., the first insulating layer), a thickness of a portion of the inter-layer dielectric layer 125 in a region RG corresponding to the one of the plurality of grooves 18 is greater than 0.

Optionally, the respective are of the plurality of second signal lines D (e.g., the data line 20) crosses over a corresponding first signal line G (e.g., the gate line 10) to form an intersection IS in the region RG corresponding to the one of the plurality of grooves 18. Optionally, a thickness of a portion of the inter-layer dielectric layer 125 in a region corresponding to the intersection IS greater than 0.

Figure 15:
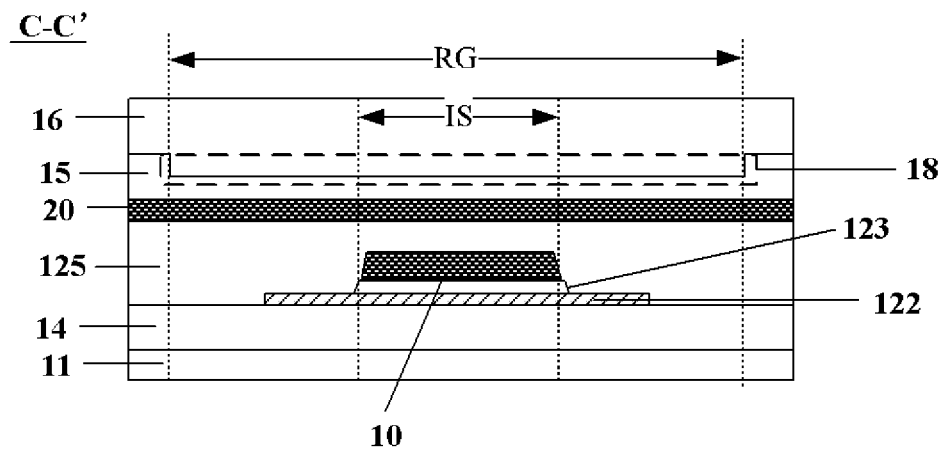
FIG. 15 is a cross-sectional view of the substantially transparent display substrate along a CC' direction in FIG. 12.

FIG. 15 is a cross-sectional view of the substantially transparent display substrate along a CC' direction in FIG. 12. Referring to FIG. 12 and FIG. 15, for example, one of the plurality of grooves 18 partially extends into the passivation layer 15 (e.g., the first insulating layer), a thickness of a portion of the passivation layer 15 in a region RG corresponding to the one of the plurality of grooves 18 is greater than 0.

Optionally, the respective use of the plurality of second signal lines D (e.g., the data line 20) crosses aver a corresponding first signal line G (e.g., the gate line 10) to form an intersection IS in the region RG corresponding to the one of the plurality of grooves 18. Optionally, a thickness of a portion of the passivation layer 15 in a region corresponding to the intersection IS greater than 0.

Figure 16:
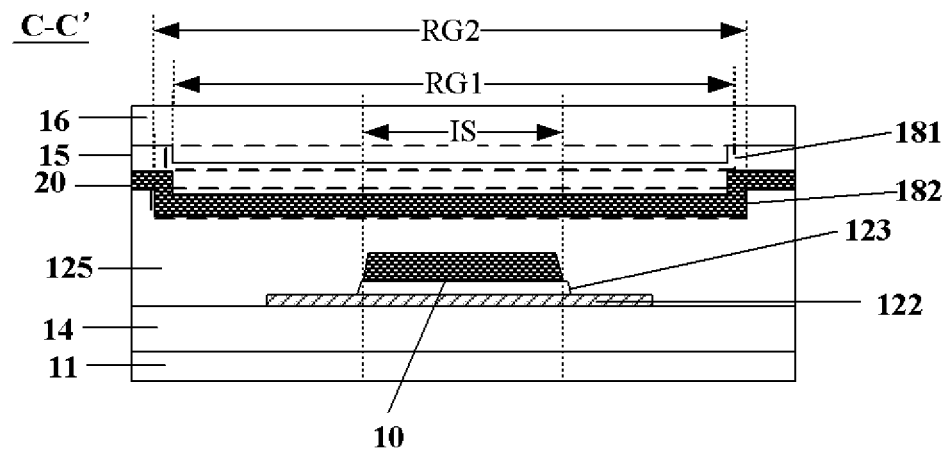
FIG. 16 is a cross-sectional view of the substantially transparent display substrate along a CC' direction in FIG. 12.

FIG. 16 is a cross-sectional view of the substantially transparent display substrate along a CC' direction in FIG. 12. Referring to FIG. 12 and FIG. 16, for example, a first groove 181 of the plurality of grooves 18 partially extends into the passivation layer 15 (e.g., the first insulating layer), a thickness of a portion of the passivation layer 15 in a first region RG1 corresponding to the first grooves 181 of the plurality of grooves 18 is greater than 0. A second groove 182 of the plurality of grooves 18 partially extends into the inter-layer dielectric layer 125 (e.g., the second insulating layer), a thickness of a portion of the inter-layer dielectric layer 125 in a second region RG2 corresponding to the second groove 182 of the plurality of grooves 18 is greater than 0.

Optionally, a thickness of a portion of the passivation layer 15 and a thickness of a portion of the inter-layer dielectric layer 125 in a region corresponding to the intersection IS greater than 0.

Ensuring that the thickness of the portion of the passivation layer 15 and a thickness of the portion of the inter-layer dielectric layer 125 are greater than 0, the passivation layer 15 and the inter-layer dielectric layer 125 can perform function of insulation and protection.

Comparing to forming at least one of the plurality of grooves in the passivation layer shown in FIG. 15, forming at least one of the plurality of grooves in the inter-layer dielectric layer shown in FIG. 14 and FIG. 16 can allow the data line to extend into one of the plurality of grooves in the inter-layer dielectric layer, it is easy for the data line to climb up a step caused by the gate line in a region where the date line crosses over the corresponding gate line.

In some embodiments, the first insulating layers of the multiple insulating layers is on a side of the plurality of first signal lines closer to the base substrate, and the second insulating layers of the multiple insulating layers is an the side of the plurality of first signal lines away from the base substrate. Optionally, at least the first insulating layers of the multiple insulating layers is on a side of the plurality of first signal lines closer to the base substrate, and at least the second insulating layers of the multiple insulating layers is on the side of the plurality of first signal lines away from the base substrate.

Optionally, at least one of the plurality of grooves at least partially extends into the first insulating layer, and at least one of the plurality of grooves at least partially extends into the second insulating layer. Optionally, a thickness of each of the multiple insulating layers is greater than 0 in a region corresponding to the respective one of the plurality of grooves. Optionally, a thickness of at least one of the multiple insulating layers (e.g., the second insulating layer), on the side of the plurality of first signal lines away from the base substrate, is greater than 0 in a region corresponding to the at least one of the plurality of grooves. Optionally, the data line crosses over the gate line to form an intersection in a region corresponding to the respective one of the plurality of grooves.

Figure 17:
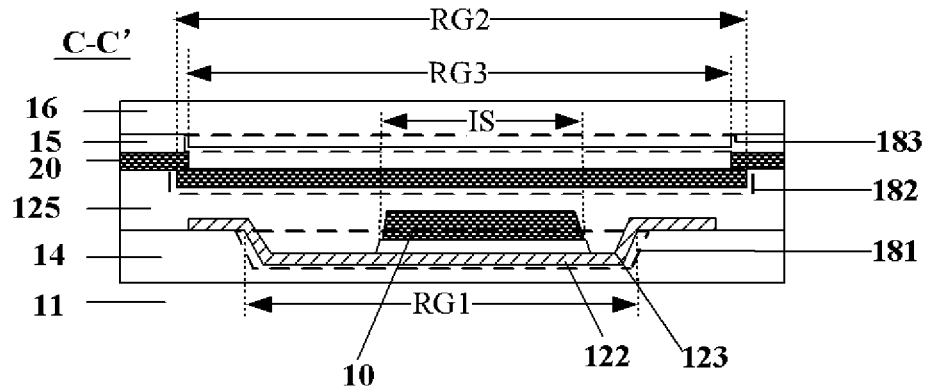
FIG. 17 is a cross-sectional view of the substantially transparent display substrate along a CC' direction in FIG. 12.

FIG. 17 is a cross-sectional view of the substantially transparent display substrate along a CC' direction in FIG. 12. In some embodiments, referring to FIG. 12 and FIG. 17, a first groove 181 of the plurality of grooves 18 is in the buffer layer 14 (e.g., the first insulating layer), a second groove 182 of the plurality of grooves 18 is in the inter-layer dielectric layer 125 (e.g., the second insulating layer), and a third groove 183 of the plurality of grooves 18 is in the passivation layer 15 (e.g., the third insulating layer). So, in a region corresponding the first groove 181, a thickness of the buffer layer 14 is equal to or greater than 0. In a region corresponding to the second groove 182, a thickness of the inter-layer dielectric layer 125 is greater than 0. In a region corresponding to the third groove 183, a thickness of the passivation layer 15 is greater than 0.

Since the data line 20 can extend into the inter-layer dielectric layer 125, it is easy for the data line to climb up a step caused by the corresponding gate line in a region where the date line crosses over the corresponding gate line, and it also benefit a subsequent process of forming a planarization layer on a side of the passivation layer 15 away from the base substrate. Ensuring that the thickness of the portion of the passivation layer 15 and a thickness of the portion of the inter-layer dielectric layer 125 in are greater than 0, the passivation layer 15 and the inter-layer dielectric layer 125 can perform function of insulation and protection.

In some embodiments, referring to FIG. 12, the substantially transparent display substrate includes a plurality of gate lines (e.g., G1 to Gn) and a plurality of data lines (e.g., D1 to Dm). A number of the plurality of gate lines is n, and a number of the plurality of data lines is m, wherein n and m are both positive integer greater than 2. Optionally, a respective one of the plurality of gate lines crosses over the plurality of data lines. Optionally, a respective one of the plurality of data lines crosses over the plurality of gate lines.

In some embodiments, referring to FIG. 12, in a respective one of the plurality of subpixel regions SPR, the light emitting sub-region B and the substantially transparent sub-region C are arranged along the first direction (Direction 1).

Optionally, lines of the plurality of gate lines G other than the first gate line G1 respectively cross over regions corresponding to rows, along the second direction (Direction 2), of the first signal line groove portions SLGP1. For example, the i-th gate line crosses over a region corresponding to a row of the first signal line groove portions SLGP1 respectively in a (i−1)-th row of the subpixel regions SPR. ($2 \geq i \geq n$)

Optionally, the plurality of data lines D respectively cross over regions corresponding to columns, along the first direction (Direction 1), of the second signal line groove portions SLGP2. For example, the j-th data line crosses over a region corresponding to a column of the second signal line groove portions SLGP2 respectively in a j-th column of the subpixel regions SPR. ($1 \leq j \leq m$)

Figure 18:
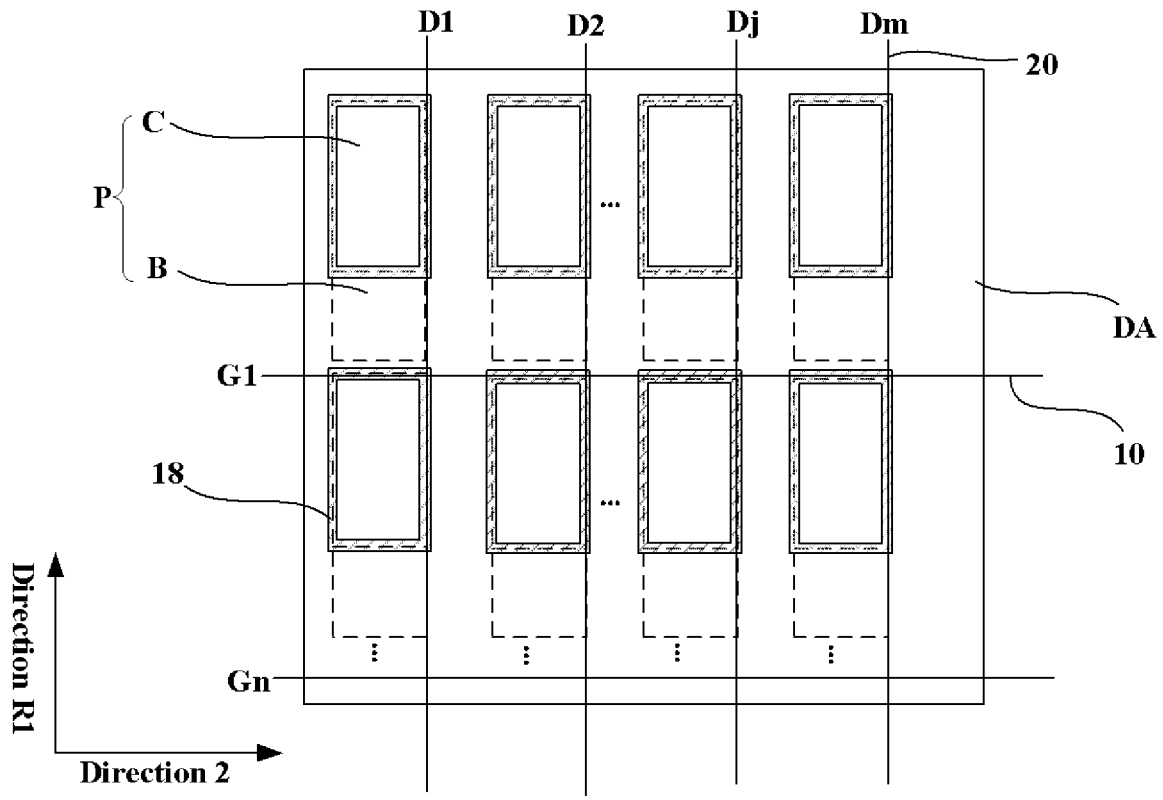
FIG. 18 is a plan view of a substantially transparent display substrate in some embodiments according to the present disclosure.

FIG. 18 is a plan view of a substantially transparent display substrate in some embodiments according to the present disclosure. Referring to FIG. 18, in some embodiments, in the respective one of the plurality of subpixel regions SPR, the light emitting sub-region B and the substantially transparent sub-region C are arranged along a reversed first direction (Direction R1), which is a reversed direction with respect to the first direction (Direction 1).

Optionally, lines of the plurality of gate lines G other than the last gate line Gn respectively cross over regions corresponding to rows, along the second direction (Direction 2), of the first signal line groove portions SLGP1. For example, the i-th gate line crosses over a region corresponding to a row of the first signal line groove portions SLGP1 respectively in a (i+1)-th row of the subpixel regions SPR. ($1 \geq i \geq n-1$)

Optionally, the plurality of data lines D respectively cross over regions corresponding to columns, along the first direction (Direction 1), of the second signal line groove portions SLGP2. For example, the j-th data line crosses over a region corresponding to a column of the second signal line groove portions SLGP2 respectively in a j-th column of the subpixel regions SPR. ($1 \geq j \geq m$)

Figure 19:
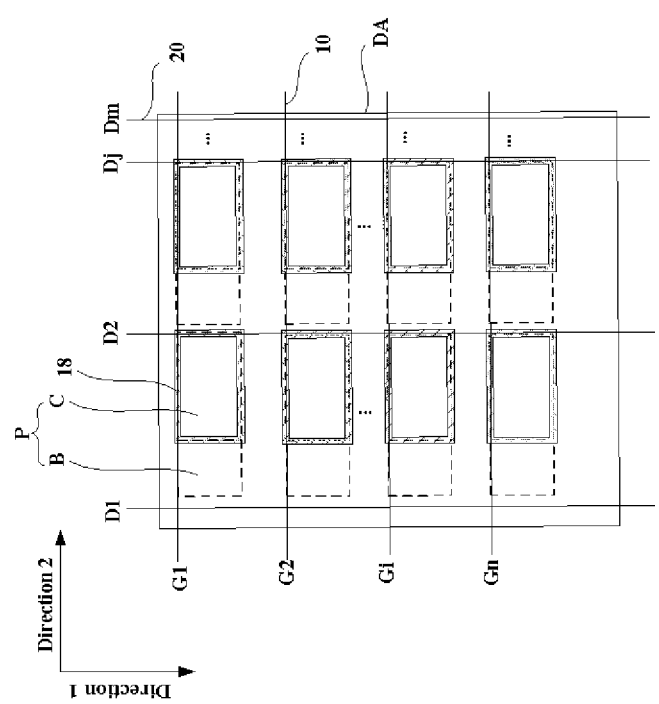
FIG. 19 is a plan view of a substantially transparent display substrate in some embodiments according to the present disclosure.

FIG. 19 is a plan view of a substantially transparent display substrate in some embodiments according to the present disclosure. Referring to FIG. 19, in some embodiments, in the respective one of the plurality of subpixel regions SPR, the light emitting sub-region B and the substantially transparent sub-region C are along the second direction (Direction 2).

Optionally, the plurality of gate lines G respectively cross over regions corresponding to rows, along the second direction (Direction 2), of the first signal line groove portions SLGP1. For example, the i-th gate line crosses over a region corresponding to a row of the first signal line groove portions SLGP1 respectively in a i-th row of the subpixel regions SPR. ($1 \geq i \geq n$)

Optionally, lines of the plurality of data lines D other than the first data line D1 respectively cross over regions corresponding to columns, along the first direction (Direction 1), of the second signal line groove portions SLGP2. For example, the j-th data line crosses over a region corresponding to a column of the second signal line groove portions SLGP2 respectively in a (j−1)-th column of the subpixel regions SPR. ($2 \geq j \geq m$)

Figure 20:
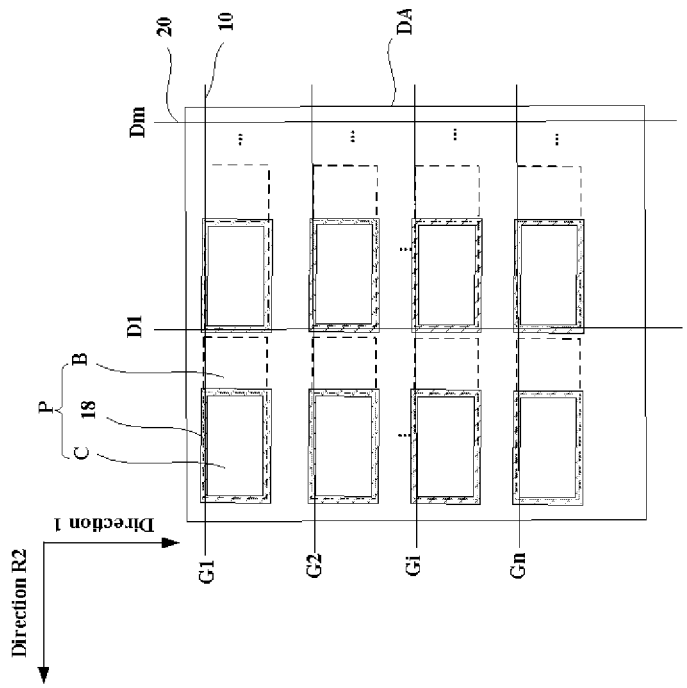
FIG. 20 is a plan view of a substantially transparent display substrate in some embodiments according to the present disclosure.

FIG. 20 is a plan view of a substantially transparent display substrate in some embodiments according to the present disclosure. Referring to FIG. 20, in some embodiments, the light emitting sub-region B and the substantially transparent sub-region C are along a reversed second direction (Direction R2) which is a reversed direction with respect to the second direction (Direction 2).

Optionally, the plurality of gate lines G respectively cross over regions corresponding to rows, along the second direction (Direction 2), of the first signal line groove portions SLGP1. For example, the i-th gate line crosses over a region corresponding to a row of the first signal line groove portions SLGP1 respectively in a i-th row of the subpixel regions SPR. ($1 \geq i \geq n$)

Optionally, lines of the plurality of data lines D other than the last data line Dm respectively cross over regions corresponding to columns, along the first direction (Direction 1), of the second signal line groove portions SLGP2. For example, the j-th data line crosses over a region corresponding to a column of the second signal line groove portions SLGP2 respectively in a (j+1)-th column of the subpixel regions SPR. ($2 \geq j \geq m-1$)

Figure 21:
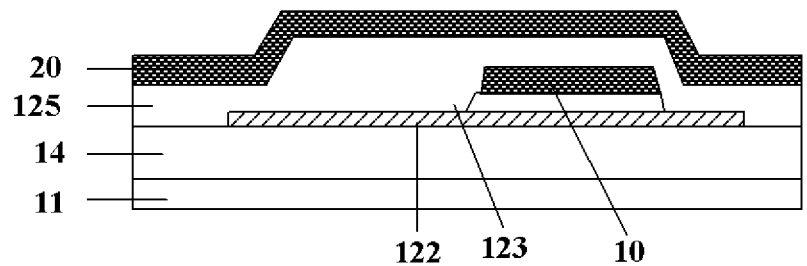
FIG. 21 is a cross-sectional view of a substantially transparent display substrate having a buffer layer absent of grooves and an inter-layer dielectric layer absent of grooves in some embodiments according to the present disclosure.

FIG. 21 is a cross-sectional view of a substantially transparent display substrate having a buffer layer absent of grooves and an inter-layer dielectric layer absent of grooves in some embodiments according to the present disclosure. Comparing to FIG. 21, a respective one of all or most of the plurality of gate line 10, in FIG. 13, ends into at least one of the plurality of grooves 18 in the buffer layer 14, in the region corresponding to the intersection of the respective one of the plurality of gate line 10 and a corresponding data line, it is easily for the corresponding data line to climb a step caused by the respective one of the plurality of gate line 10, and step differences between different layers in the substantially transparent display substrate 1 is effectively reduce to allow the planarization layer easily formed on the multiple layers in the substantially transparent display substrate 1.

Comparing to FIG. 21, a respective one of all or most of the plurality of data line 20, in FIG. 14 or FIG. 16, extends into at least one of the plurality of grooves 18 in the inter-layer dielectric layer 125, in the region corresponding to the intersection tithe respective one of the plurality of gate line 10 and a corresponding data line, it is easily for the corresponding data line to climb a step caused by the respective one of the plurality of gate line 10, and step differences between different layers in the substantially transparent display substrate 1 is effectively reduce to allow the planarization layer easily formed an the multiple layers in the substantially transparent display substrate 1.

Comparing to FIG. 21, a respective one of all or most of the plurality of gate line 10, in FIG. 17, extends into at least one of the plurality of grooves 18 in the buffer layer 14, and a respective one of all or most of the plurality of data line 20, in FIG. 17, extends into at least one of the plurality of grooves 18 in the inter-layer dielectric layer 125, in the region corresponding to the intersection of the respective one of the plurality of gate line 10 and a corresponding data line, it is easily for the corresponding data line to climb a step caused by the respective one of the plurality of gate line 10, and step differences between different layers in the substantially transparent display substrate 1 is effectively reduce to allow the planarization layer easily formed on the multiple layers in the substantially transparent display substrate 1.

Figure 22:
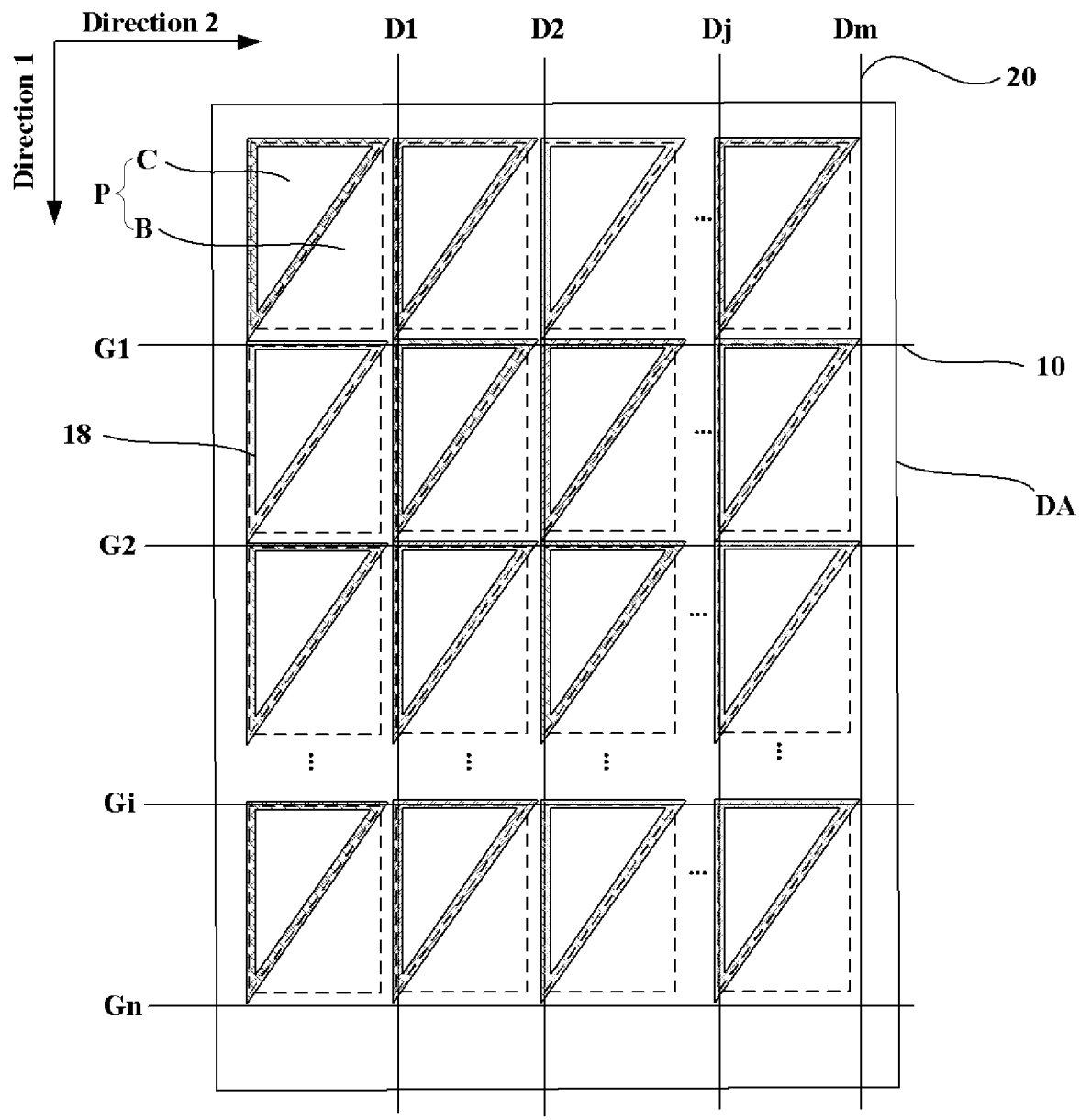
FIG. 22 is a plan view of a substantially transparent display substrate in some embodiments according to the present disclosure.

FIG. 22 is a plan view of a substantially transparent display substrate in some embodiments according to the present disclosure. Referring to FIG. 22, at least a portion of the respective one of the plurality of grooves 18 is in a diagonal region of the substantially transparent sub-region C in the respective one of the plurality of subpixel regions SPR. Optionally, a respective one of a portion of plurality of gate line 10 extends into at least one of the plurality of grooves 18. In the region corresponding to the intersection of the respective one of the plurality of gate line 10 and a corresponding data line, it is easily for the corresponding data line to climb a step caused by the respective or of the plurality of gate line 10, and step differences between different layers in the substantially transparent display substrate 1 is effectively reduce to allow the planarization layer easily famed on the multiple layers in the substantially transparent display substrate 1.

In another aspect, the present disclosure also provides a substantially transparent display apparatus. In some embodiments, the substantially transparent display apparatus includes the substantially display substrate described herein.

Figure 23:
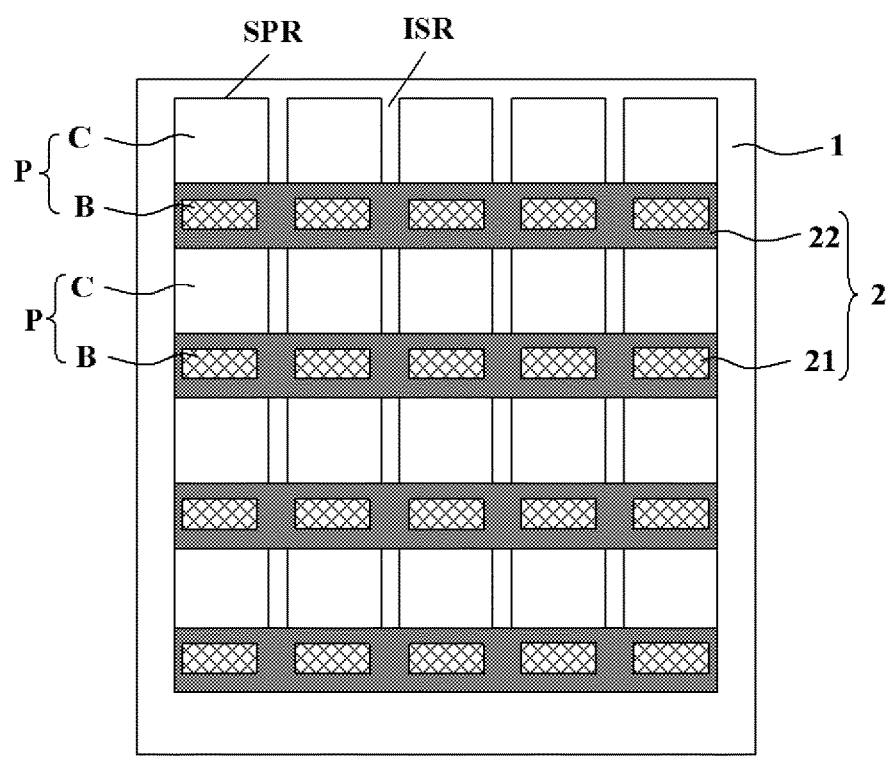
FIG. 23 is a plan view of a substantially transparent display apparatus in some embodiments according to the present disclosure.

FIG. 23 is a plan view of a substantially transparent display apparatus in some embodiments according to the present disclosure. Referring to FIG. 23, in some embodiments, the substantially transparent display apparatus further includes a counter substrate 2 on the substantially transparent display substrate 1. Optionally, the counter substrate 2 includes a color filter 21 configured to filter different color, and a black matrix 22 configured to block light. Optionally, the black matrix 22 includes a plurality of black matrix bars about edges of a plurality of light emitting sub-regions B respective on the plurality of subpixel regions SPR. The plurality of black matrix bars define the plurality of light emitting sub-regions B. Optionally, the color filter 21 is in regions defined by the black matrix 22. Optionally, the color filter 21 is in the plurality of light emitting regions B.

In some embodiments, referring to FIG. 5A and FIG. 23, the black matrix 22 covers a region corresponding to the plurality of grooves 18. Optionally, the black matrix 22 covers a region corresponding to a portion of the plurality of grooves 18.

In some embodiments, the color filter 21 includes a first color filtering pattern, a second color filtering pattern, and a third color filtering pattern. For example, the first color filtering pattern, the second color filtering pattern, and the third color filtering pattern are in different subpixel regions.

By forming the color filter 21 and the black matrix 22 in the counter substrate 2, the substantially transparent display substrate can be used to form a large size display apparatus.

Optionally, the substantially transparent display apparatus further includes a respective one of the plurality of grooves about an edge of the substantially transparent sub-region of the respective one of the plurality of subpixel regions. Optionally, a respective one of the plurality of first signal lines crosses over a region corresponding to a row, along the second direction, of the first signal line groove portions. Optionally, a respective one of the plurality of second signal lines crosses over a region corresponding to a column, along the first direction, of the second signal line groove portions.

Figure 24A:
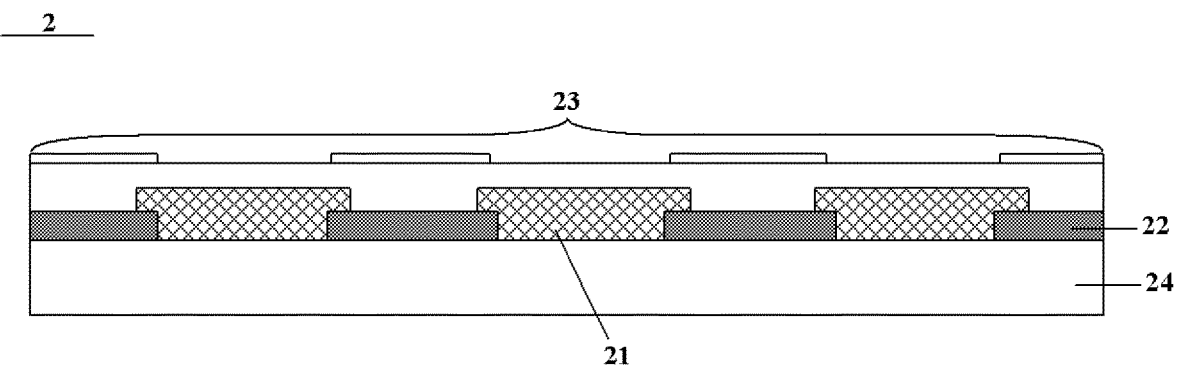
FIG. 24A is a cross-sectional view of a counter substrate in some embodiments according to the present disclosure.

FIG. 24A is a cross-sectional view of a counter substrate in some embodiments according to the present disclosure. In some embodiments, referring to FIG. 24A, the counter substrate 2 further includes an auxiliary cathodes 23. Optionally, the auxiliary cathodes 23 is configured to be electrically connected to the plurality of cathodes 133.

Figure 24B:
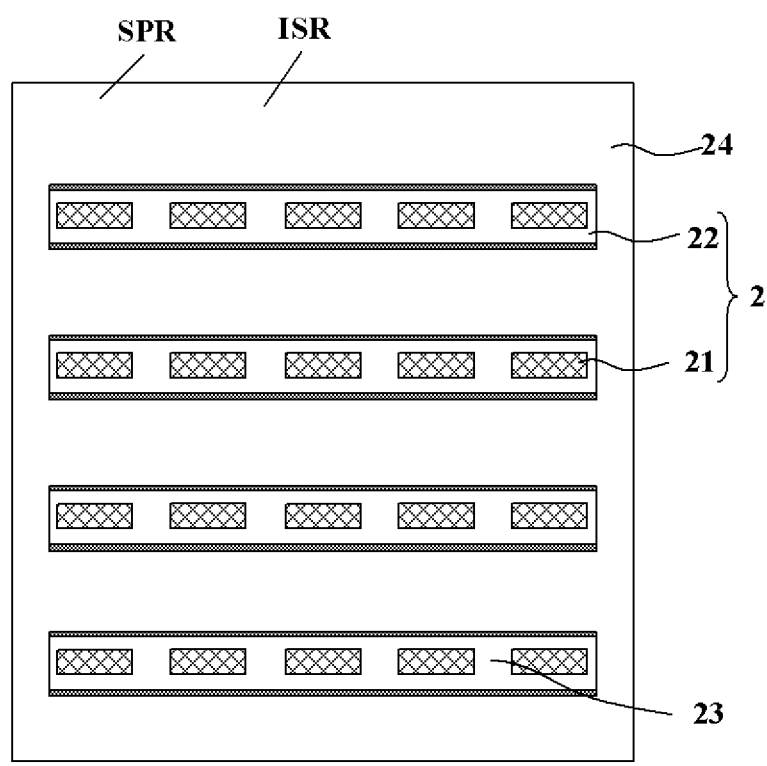
FIG. 24B is a plan view of a counter substrate in some embodiments according to the present disclosure.

FIG. 24B is a plan view of a counter substrate in some embodiments according to the present disclosure. In some embodiments, referring to FIG. 24B, an orthographic projection of the black matrix 22 on a glass substrate 24 of the counter substrate 2 coven an orthographic projection of the auxiliary cathodes 23 on the glass substrate 24, which can avoids reducing the aperture ratio of the substantially transparent display apparatus.

Optionally, the auxiliary cathodes 23 includes a metal material. Optionally, the auxiliary cathodes 23 has a shape similar to a shape of the black matrix, for example, a grid shape.

By electrically connect the auxiliary cathodes 23 to the plurality of cathodes 133, the IR drop of the plurality of cathodes 133 can be reduced.

Examples of appropriate substantially transparent display apparatuses include, but are not limited to, a substantially transparent devices, VR glasses, AR glasses, smart glass, an electronic paper, a mobile phone, a tablet computer, a television, a monitor, a notebook computer, a digital album, a GPS, etc.

In another aspect, the present disclosure also provides a method of fabricating a substantially transparent display substrate described herein. In some embodiments, the method of fabricating a substantially transparent display substrate includes proving a base substrate; forming multiple insulating layers an the base substrate and in a display area of the substantially transparent display substrate; and forming a plurality of grooves in at least a first insulating layer of the multiple insulating layer. Optionally, the display area includes a plurality of subpixel regions spaced apart from each other by an inter-subpixel region. Optionally, a respective one of the plurality of subpixel regions includes a light emitting sub-region and a substantially transparent sub-region. Optionally, at least one of the plurality of grooves are formed to at least partially extend into the first insulating layer. Optionally, at least a portion of a respective one of the plurality of grooves is formed about an edge of the substantially transparent sub-region of the respective one of the plurality of subpixel regions.

In some embodiments, referring to FIG. 7, a buffer layer 14 is formed on the base substrate 11 using a sputtering process or a deposition process. At least a portion of at least one of the plurality of grooves 18 is formed about the edge E of the substantially transparent sub-region C of at least one of the plurality of subpixel regions SPR, using an exposure process and an etching process. The at least one of the plurality of grooves 18 can reduce the stress in the buffer layer 14, can allow the adsorption process to be successfully performed.

Optionally, a plurality of thin film transistors 12, a passivation layer 15, a planarization layer 16, and a plurality of light emitting elements 13 are sequentially formed on the buffer layer 14.

In some embodiments, the plurality of subpixel regions are formed in array. Optionally, a plurality of gate lines and a plurality of data lines are famed, and the inter-layer dielectric layer and the passivation layer ace formed between the plurality of gate lines and the plurality of data lines. At least one of the plurality of grooves is formed in at least one of the inter-layer dielectric layer or the passivation layer, and at least a portion thereof is about the edge of the substantially transparent sub-region of at least one of the plurality of subpixel regions. In a region corresponding to are of the plurality of grooves, a thickness of the inter-layer dielectric layer or a thickness of the passivation layer is greater than 0.

In some embodiments, referring to FIG. 12, lines of the plurality of gate lines G other than the first gate line G1 respectively cross over regions corresponding to rows, along the second direction (Direction 2), of the first signal line groove portions SLGP1. For example, the i-th gate line crosses over a region corresponding to a row of the first signal line groove portions SLGP1 respectively in a (i−1)-th row of the subpixel regions SPR. (2≥i≥n)

Optionally, the plurality of data lines D respectively cross over regions corresponding to columns, along the first direction (Direction 1), of the second signal line groove portions SLGP2. For example, the j-th data line crosses over a region corresponding to a column of the second signal line groove portions SLGP2 respectively in a j-th column of the subpixel regions SFR. (1≥j≥m)

In some embodiments, referring to FIG. 18, lines of the plurality of gate lines G other than the last gate line Gn respectively cross over regions corresponding to rows, along the second direction (Direction 2), of the first signal line groove portions SLGP1. For example, the i-th gate line crosses over a region corresponding to a row of the first signal line groove portions SLGP1 respectively in a (i+1)-th row of the subpixel regions SPR. (1≤i≥n−1)

Optionally the plurality of data lines D respectively cross aver regions corresponding to columns, along the first direction (Direction 1), of the second signal line groove portions SLGP2. For example, the j-th data line crosses over a region corresponding to a column of the second signal line groove portions SLGP2 respectively in a j-th column of the subpixel regions SPR. (1≥j≥m)

In some embodiments, referring to FIG. 19, the plurality of gate lines G respectively cross over regions corresponding to rows, along the second direction (Direction 2), of the first signal line groove portions SLGP1. For example, the i-th gate line crosses over a region corresponding to a row of the first signal line groove portions SLGP1 respectively in a i-th row of the subpixel regions SPR. (1≥i≥n)

Optionally, lines of the plurality of data lines D other than the first data line D1 respectively cross over regions corresponding to columns, along the first direction (Direction 1), of the second signal line groove portions SLGP2. For example, the j-th data line crosses over a region corresponding to a column of the second signal line groove portions SLGP2 respectively in a (j−1)-th column of the subpixel regions SPR. (2≥j≥m)

In some embodiments, referring to FIG. 20, the plurality of gate lines G respectively cross over regions corresponding to rows, along the second direction (Direction 2), of the first signal line groove portions SLGP1. For example, the i-th gate line crosses over a region corresponding to a row of the first signal line groove portions SLGP1 respectively in a i-th row of the subpixel regions SPR. (1≥i≥n)

Optionally, lines of the plurality of data lines D other than the last data line Dm respectively cross over regions corresponding to columns, along the first direction (Direction 1), of the second signal line groove portions SLGP2. For example, the j-th data line crosses over a region corresponding to a column of the second signal line groove portions SLGP2 respectively in a (j+1)-th column of the subpixel regions SPR. (2≥j≥m−1)

Arrangements of grooves in FIG. 12, FIG. 18, FIG. 19, and FIG. 20, can reduce step differences between different layers in the substantially transparent display substrate 1, which is step differences between went layers in the substantially transparent display substrate 1. a respective one of the plurality of gate lines can extend into at least one of the plurality of grooves, and an intersection between the respective one of the plurality of gate lines and a corresponding data line is in a region corresponding to the respective one of the plurality of grooves, which is easy for the corresponding data line to climb a step caused by the respective one of the plurality of gate lines.

In some embodiments, the respective one of the plurality of grooves is in the substantially transparent sub-region but away from (e.g., spaced apt from) the edge of the substantially transparent.

Referring to FIG. 10, optionally, an inter-layer dielectric layer 125 is formed when the plurality of the thin film transistors 12 are famed on the base substrate 11. Optionally, at least one of the plurality of grooves 18 is formed to at least partially extend into the inter-layer dielectric layer 125, at least a portion thereof is about the edge of the substantially transparent sub-region of the at least one of the plurality of subpixel regions SPR. Optionally, at least one of the plurality of grooves 18 is formed to at least partially extend into the passivation layer 15, at least a portion thereof is about the edge of the substantially transparent sub-region of the at least one of the plurality of subpixel regions SPR.

Since the inter-layer dielectric layer 125 is on a side of the plurality of gate lines 10 away from the base substrate 11, the passivation layer 15 is on a side of the plurality of data lines 20 away from the base substrate 11, in order for the inter-layer dielectric layer 125 and the passivation layer 15 to perform protection and insulation function, in the substantially transparent sub-region, a thickness of a portion of the inter-layer dielectric layer 125 is greater than 0, and a thickness of a portion of the passivation layer 15 is greater than 0.

In some embodiments, referring to FIG. 11A, a portion of the inter-layer dielectric layer 125 in the substantially transparent sub-region of the at least one of the plurality of subpixel regions is etched to form at least are of the plurality of grooves 18, so, the inter-layer dielectric layer 125 is dally absent from the substantially transparent sub-region of the at least one of the plurality of subpixel regions SPR. Optionally, a portion of the passivation layer 15 in the substantially transparent sub-region of the at least one of the plurality of subpixel regions is etched to form at least one of the plurality of grooves 18, so, the passivation layer 15 is substantially absent from the substantially transparent sub-region of the at least one of the plurality of subpixel regions SPR.

Optionally, a planarization layer 16 is formed on a side of the passivation layer away from the base substrate 11 and extend into grooves 18 in the substantially transparent sub-region of the at least one of the plurality of subpixel regions SPR where the inter-layer dielectric layer 125 and the passivation layer 15 are substantially absent. Optionally, the planarization layer 16 includes a first planarization sub-layer 161 and a second planarization sub-layer 162. For example, the first planarization sub-layer 161 is formed using materials including a resin material. Optionally, the second planarization sub-layer 162 is formed using materials including SOG. Since a planarization layer formed with a resin material may have microcosms which may lead to a short between the anode and the cathode, adding a SOG layer can avoid the short between the anode and the cathode.

The foregoing description of the embodiments of the invention has been presented for proposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all berms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation an the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A substantially transparent display substrate, comprising:
   a base substrate;
   multiple insulating layers on the base substrate and in a display area of the substantially transparent display substrate; and
   a plurality of grooves in at least a first insulating layer of the multiple insulating layers, wherein at least one of the plurality of grooves at least partially extending into the first insulating layer;
   wherein the display area comprises a plurality of subpixel regions spaced apart from each other by an inter-subpixel region;
   a respective one of the plurality of subpixel regions comprises a light emitting sub-region and a substantially transparent sub-region;
   at least a portion of a respective one of the plurality of grooves is about an edge of the substantially transparent sub-region of the respective one of the plurality of subpixel regions;
   at least a first portion of the respective one of the plurality of grooves has a first elongated shape in plan view of the substantially transparent display substrate;
   the first elongated shape has a length along a direction substantially parallel to a first edge of the substantially transparent sub-region of the respective one of the plurality of subpixel regions; and
   the length of the first elongated shape per subpixel is at least 50% of a width or a length of the substantially transparent sub-region of the respective one of the plurality of subpixel regions.

2. The substantially transparent display substrate of claim 1, wherein the first insulating layer is a layer selected from a group consisting of a buffer layer, an inter-layer dielectric layer, and a passivation layer.

3. The substantially transparent display substrate of claim 1, wherein the respective one of the plurality of grooves is at least partially in the inter-subpixel region.

4. The substantially transparent display substrate of claim 1, wherein the respective one of the plurality of grooves is at least partially in the substantially transparent sub-region of the respective one of the plurality of subpixel regions.

5. The substantially transparent display substrate of claim 1, wherein the respective one of the plurality of grooves crosses over an interface between the substantially transparent sub-region of the respective one of the plurality of subpixel regions and the inter-subpixel region.

6. The substantially transparent display substrate of claim 1, wherein the respective one of the plurality of grooves substantially surrounds a perimeter of the substantially transparent sub-region of the respective one of the plurality of subpixel regions.

7. The substantially transparent display substrate of claim 1, further comprising a plurality of first signal lines in the inter-subpixel region;
   wherein a respective one of the plurality of first signal lines is substantially parallel to, and extends over, substantially an entirety of the length of the first elongated shape.

8. The substantially transparent display substrate of claim 7, wherein the respective one of the plurality of first signal lines is a gate line on a side of the first insulating layer away from the base substrate;
   the substantially transparent display substrate further comprises a data line on a side of the gate line away from the base substrate; and
   the data line crosses over the gate line forming an intersection in a region corresponding to the respective one of the plurality of grooves.

9. The substantially transparent display substrate of claim 7, wherein the respective one of the plurality of first signal lines is a gate line on a side of the first insulating layer closer to the base substrate;
   the substantially transparent display substrate further comprises a data line on a side of the gate line away from the base substrate;
   a thickness of the at least the first insulating layer of the multiple insulating layers is greater than 0 in a region corresponding to the respective one of the plurality of grooves; and
   the data line crosses over the gate line forming an intersection in a region corresponding to the respective one of the plurality of grooves.

10. The substantially transparent display substrate of claim 7, further comprising a plurality of second signal lines in the inter-subpixel region;
    at least a second portion of the respective one of the plurality of grooves has a second elongated shape in plan view of the substantially transparent display substrate;
    the second elongated shape has a length along a direction substantially parallel to a second edge of the substantially transparent sub-region of the respective one of the plurality of subpixel regions; and
    a respective one of the plurality of second signal lines is substantially parallel to, and extends over, substantially an entirety of the length of the second elongated shape.

11. The substantially transparent display substrate of claim 10, wherein the plurality of first signal lines are arranged along a first direction, a respective one of which extending along a second direction different from the first direction;
    the plurality of second signal lines are arranged along the second direction, a respective one of which extending along the first direction;
    the plurality of grooves comprise a plurality of first signal lines groove portions and a plurality of second signal lines groove portions;

a respective one of the plurality of first signal lines crosses over a region corresponding to a row, along the second direction, of the first signal line groove portions; and a respective one of the plurality of second signal lines crosses over a region corresponding to a column, along the first direction, of the second signal line groove portions.

12. The substantially transparent display substrate of claim 1, wherein the multiple insulating layers comprises an inter-layer dielectric layer and a passivation layer; and in the substantially transparent sub-region of the respective one of the plurality of subpixel regions, one or a combination of the inter-layer dielectric layer and the passivation layer is substantially absent, thereby forming at least a portion of a respective one of the plurality of grooves, the portion extending through one or the combination of the inter-layer dielectric layer and the passivation layer.

13. The substantially transparent display substrate of claim 12, wherein the multiple insulating layer further comprises a planarization layer on a side of one or the combination of the inter-layer dielectric layer and the passivation layer away from the base substrate;

wherein the planarization layer comprises a silicon-on-glass material; and an orthographic projection of the planarization layer on the base substrate covers the display area.

14. The substantially transparent display substrate of claim 9, wherein the planarization layer comprises a first planarization sub-layer and a second planarization sub-layer on a side of the first planarization sub-layer away from the base substrate;

the first planarization sub-layer comprises a resin material; and the second planarization sub-layer comprise a silicon-on-glass material.

15. The substantially transparent display substrate of claim 13, wherein, in the substantially transparent sub-region of the respective one of the plurality of subpixel regions, the inter-layer dielectric layer and the passivation layer are substantially absent;

the planarization layer is present in the substantially transparent sub-region of the respective one of the plurality of subpixel regions; and a thickness of the planarization layer in the substantially transparent sub-region of the respective one of the plurality of subpixel regions is smaller than a combined thickness of the inter-layer dielectric layer and the passivation layer in the light emitting sub-region.

16. A substantially transparent display apparatus, comprising the substantially transparent display substrate of claim 1.

17. The substantially transparent display apparatus of claim 16, further comprising a counter substrate on the substantially transparent display substrate;

wherein the counter substrate comprises a color filter and a black matrix;

the black matrix comprises a plurality of black matrix bars defining the plurality of light emitting sub-regions;

the color filter is in the plurality of light emitting regions; and the black matrix covers a region corresponding to the plurality of grooves.

18. A method of fabricating a transparent display substrate, comprising:

proving a base substrate;

forming multiple insulating layers on the base substrate and in a display area of the substantially transparent display substrate; and forming a plurality of grooves in at least a first insulating layer of the multiple insulating layer;

wherein the display area comprises a plurality of subpixel regions spaced apart from each other by an inter-subpixel region;

a respective one of the plurality of subpixel regions comprises a light emitting sub-region and a substantially transparent sub-region;

at least one of the plurality of grooves are formed to at least partially extend into the first insulating layer;

at least a portion of a respective one of the plurality of grooves is formed about an edge of the substantially transparent sub-region of the respective one of the plurality of subpixel regions;

at least a first portion of the respective one of the plurality of grooves has a first elongated shape in plan view of the substantially transparent display substrate;

the first elongated shape has a length along a direction substantially parallel to a first edge of the substantially transparent sub-region of the respective one of the plurality of subpixel regions; and the length of the first elongated shape per subpixel is at least 50% of a width or a length of the substantially transparent sub-region of the respective one of the plurality of subpixel regions.

* * * * *